United States Patent [19]

Saeki

[11] Patent Number: 5,740,034
[45] Date of Patent: Apr. 14, 1998

[54] POSITIONING APPARATUS AND PROCESS SYSTEM HAVING THE SAME

[75] Inventor: Hiroaki Saeki, Yamanashi-ken, Japan

[73] Assignee: Tokyo Electronic Limited, Tokyo, Japan

[21] Appl. No.: 618,153

[22] Filed: Mar. 19, 1996

[30] Foreign Application Priority Data

Mar. 20, 1995 [JP] Japan .................................. 7-087483

[51] Int. Cl.⁶ .............................. B65H 1/00; G01B 11/24
[52] U.S. Cl. ............... 364/167.01; 414/331; 414/225; 414/783; 356/372; 356/373; 356/376
[58] Field of Search ............................ 414/331, 416, 414/225, 783; 364/167.01, 571.01; 356/401, 375; 250/548; 318/570

[56] References Cited

U.S. PATENT DOCUMENTS

| | | | |
|---|---|---|---|
| 4,752,898 | 6/1988 | Koenig ................................ | 364/559 |
| 4,836,733 | 6/1989 | Hertel et al. ........................ | 414/225 |
| 4,880,348 | 11/1989 | Baker et al. ........................ | 414/783 |
| 5,194,743 | 3/1993 | Aoyama et al. .................... | 250/548 |
| 5,202,842 | 4/1993 | Suzuki ................................ | 364/571.01 |
| 5,239,182 | 8/1993 | Tateyama et al. .................. | 250/559.37 |
| 5,289,263 | 2/1994 | Kiyokawa et al. ................. | 356/375 |
| 5,493,403 | 2/1996 | Nishi .................................. | 356/401 |

FOREIGN PATENT DOCUMENTS

| | | |
|---|---|---|
| 0 234 772 | 9/1987 | European Pat. Off. . |
| 64-57639 | 3/1989 | Japan . |
| WO 95/00819 | 1/1995 | WIPO . |

Primary Examiner—Emanuel T. Voeltz
Assistant Examiner—Demetra R. Smith
Attorney, Agent, or Firm—Oblon, Spivak, McClelland, Maier, & Neustadt, P.C.

[57] ABSTRACT

A semiconductor wafer positioner including a rotating table on which a wafer is placed and a peripheral shape of the wafer is optically detected as a first peripheral shape signal. A control section combines two half cycle components of the first peripheral shape signal, the components being 180° out of phase, to obtain a second peripheral shape signal exhibiting a characteristic feature of flat orientation. A peak in the second peripheral shape signal is detected, and data in the first peripheral shape signal corresponding to the peak and 180° from the peak is invalidated. A curve approximation is utilized to approximate the invalidated data to produce a third peripheral shape signal from which an eccentricity amount and direction are calculated.

16 Claims, 12 Drawing Sheets

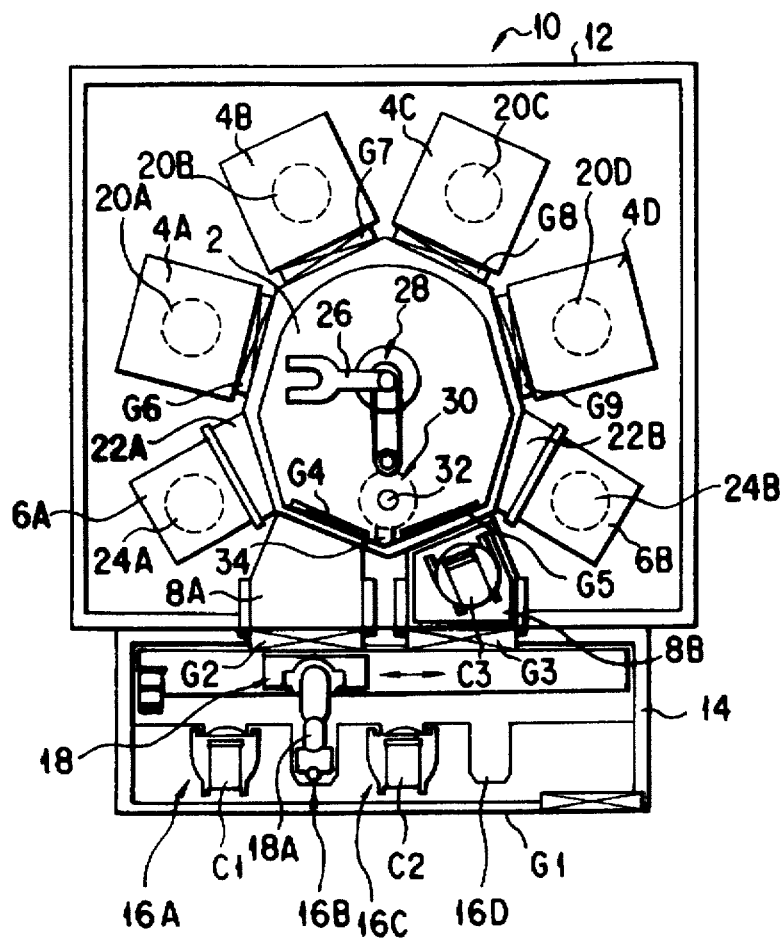
F I G. 1
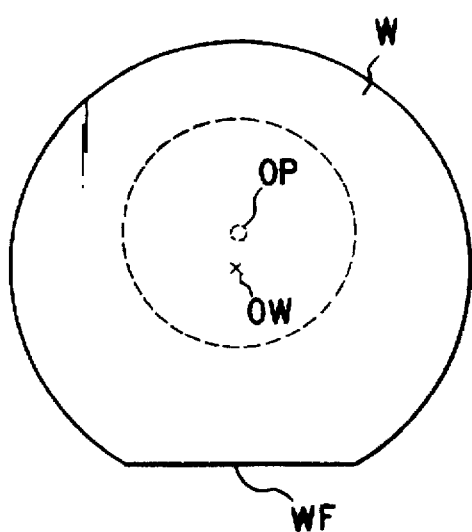
F I G. 2
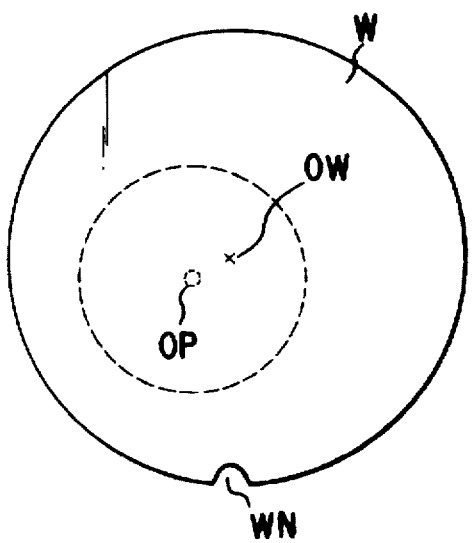
F I G. 3

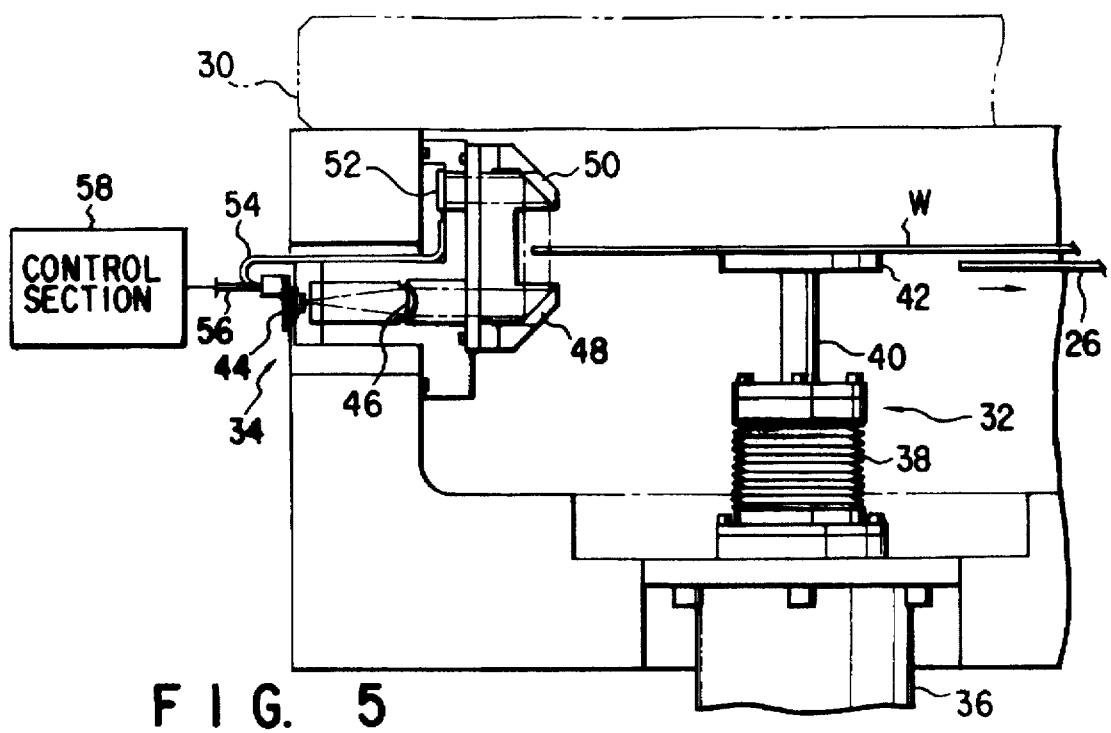
F I G. 5
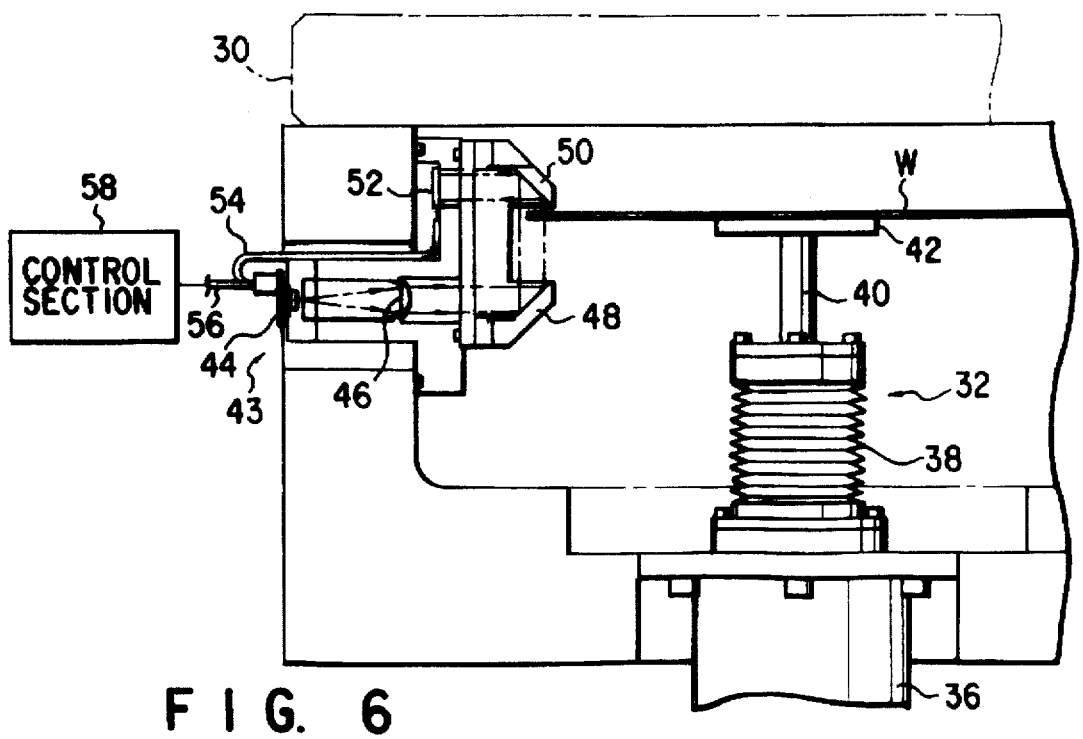
F I G. 6

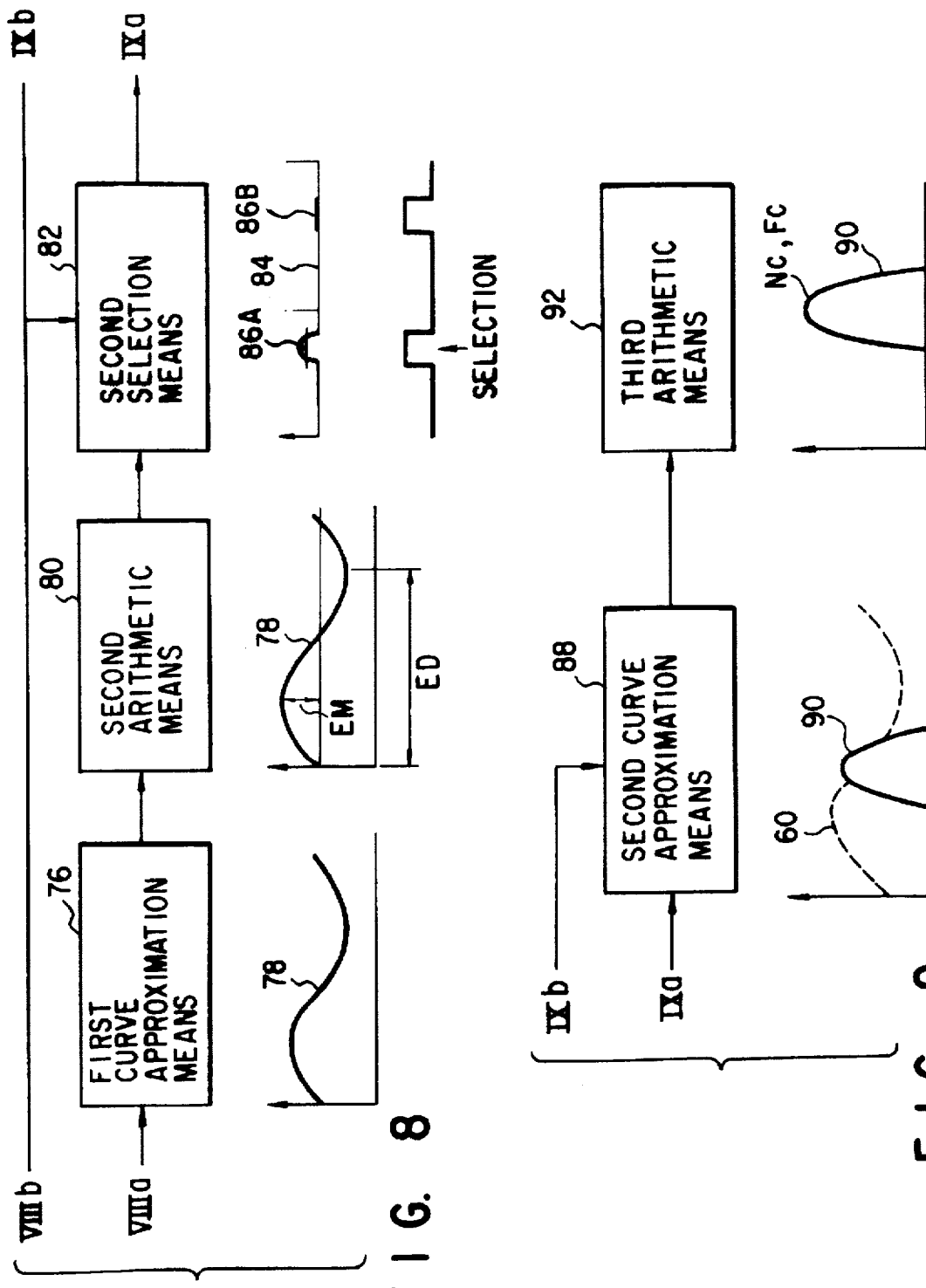

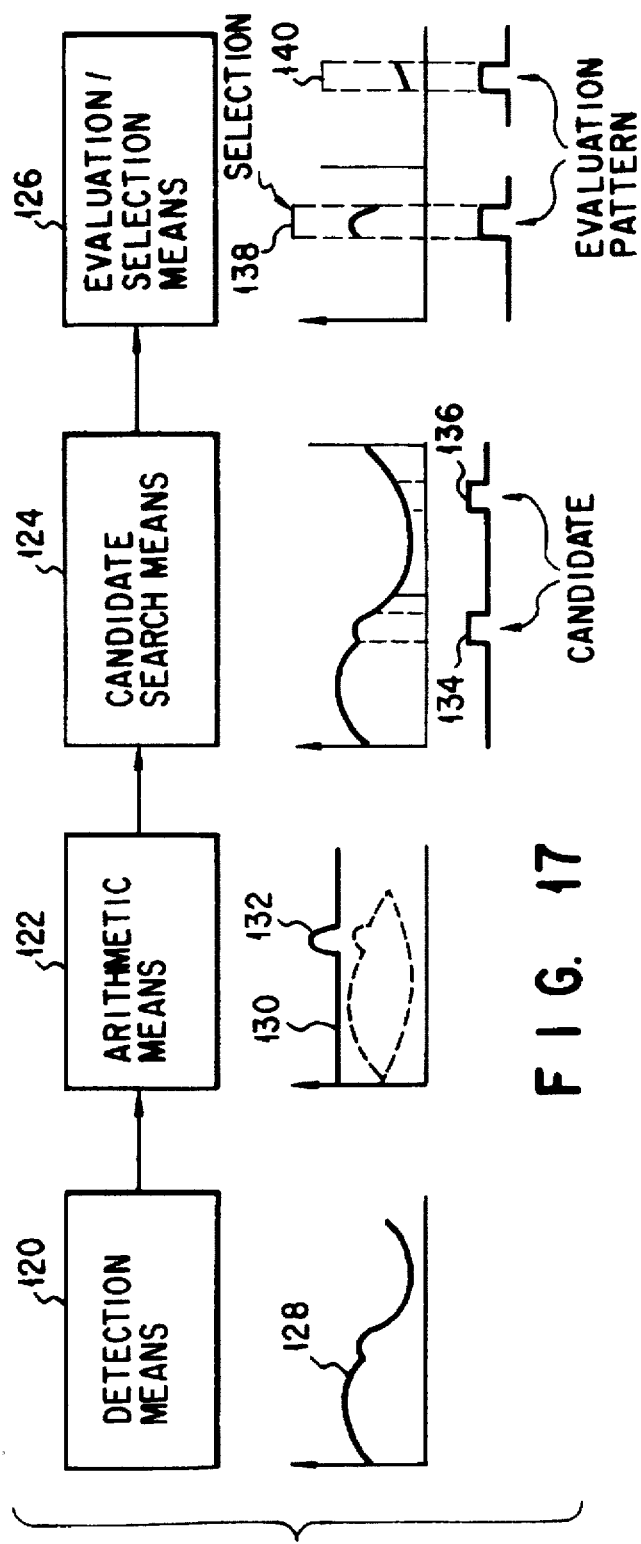
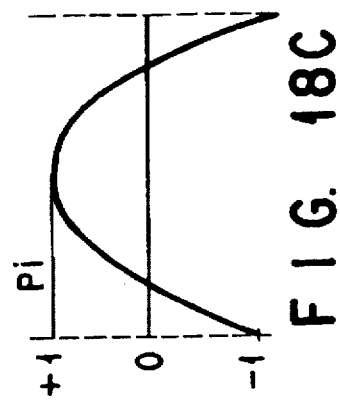
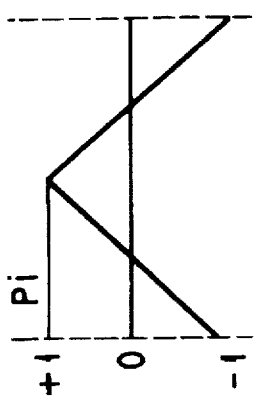
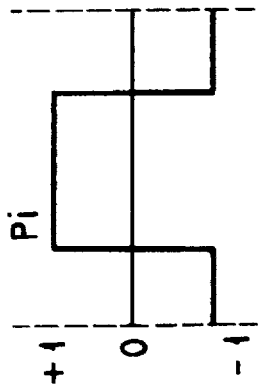

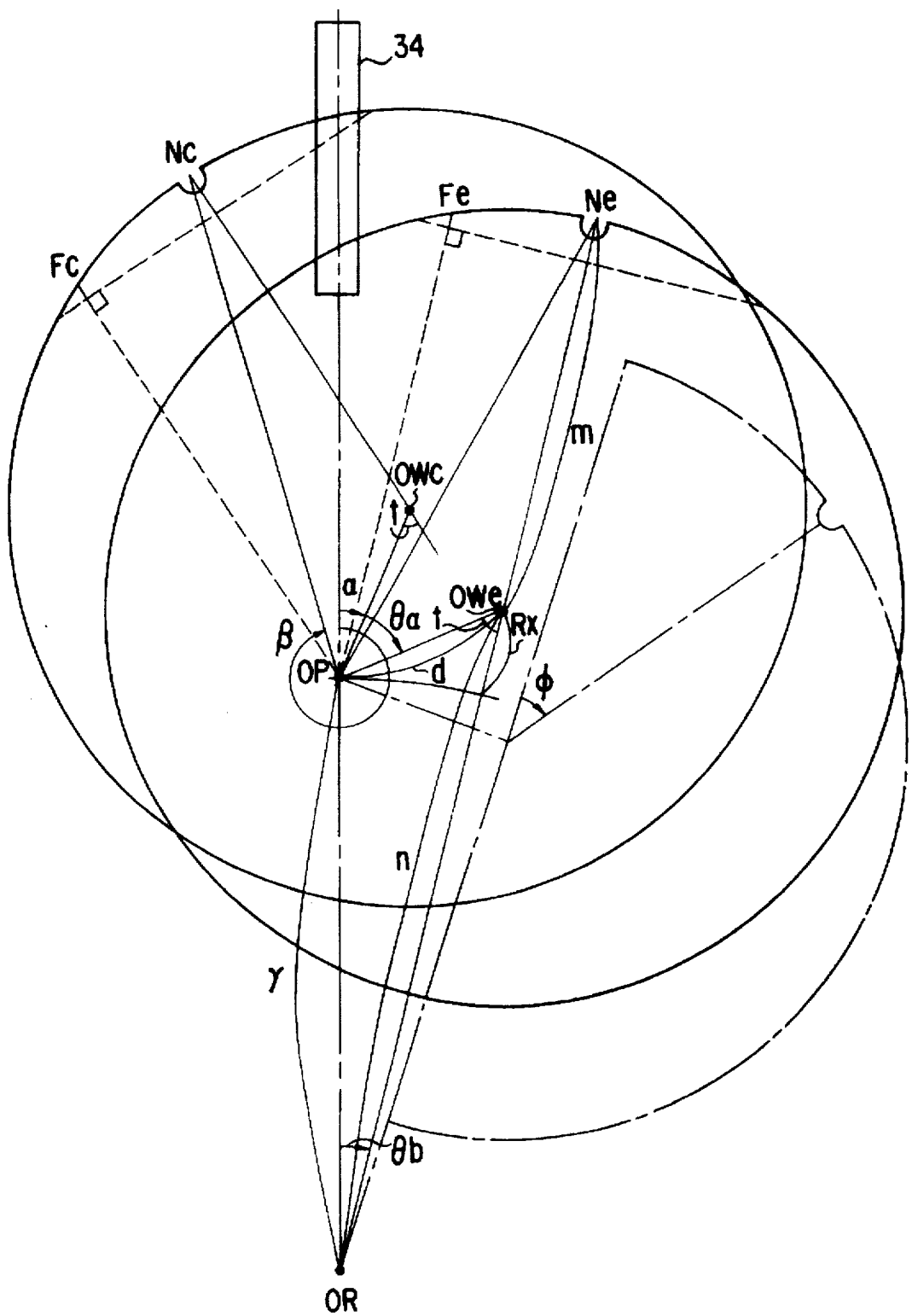
F I G. 22

POSITIONING APPARATUS AND PROCESS SYSTEM HAVING THE SAME

BACKGROUND OF THE INVENTION

1. Field of the Invention

The present invention relates to an apparatus for positioning an object (to be processed) having an almost circular contour as a dominant contour and a process system having the apparatus and, more particularly, to a positioning apparatus in a semiconductor process system.

2. Description of the Related Art

Conventionally, a semiconductor manufacturing apparatus includes a wafer positioning apparatus for loading/unloading an object (to be processed) such as a semiconductor wafer into/from a predetermined process chamber by using a transfer means such as a transfer arm.

Each wafer has a cut-out, a so-called orientation flat (WF), formed by linearly cutting a portion on the periphery of a wafer as shown in FIG. 2, or a cut-out, a so-called notch (WN), obtained by forming a recess in a portion on the periphery of a wafer as shown in FIG. 3. In this specification, cut-outs formed, as positioning marks such as orientation flats and notches, in the peripheries of objects are generically termed as cut-out marks unless specified otherwise.

An example of the above positioning apparatus is disclosed in U.S. Pat. No. 4,880,348. This positioning apparatus includes a rotating table and optical means which are disposed to oppose each other through the periphery of a wafer placed on the rotating table.

In the positioning operation, the wafer is rotated on the rotating table to obtain information associated with the peripheral shape (profile) of the periphery of the wafer by using the optical means. The eccentricity magnitude and direction of the wafer with respect to the rotation center of the rotating table are obtained from the obtained information and are used to perform an alignment. Next, information associated with the peripheral shape of the periphery of the wafer is obtained again. The direction of the cut-out mark of the wafer is obtained from the information. The rotating table is rotated by a predetermined amount to perform another alignment of the wafer with respect to the transfer arm in accordance with the direction of the cut-out mark.

In the conventional positioning apparatus, however, alignment of the wafer placed on the rotating table with respect to the cut-out mark must be performed upon alignment of the wafer with respect to the eccentricity magnitude. That is, the positioning operation requires two steps. For this reason, a relatively long period of time is required for the above process.

In addition, conventional positioning apparatuses generally use a method of obtaining the center of a wafer on the basis of, e.g., the coordinates of three points which are sampled from the periphery of the wafer. As described above, since the conventional positioning apparatuses use only the coordinates of points, the positioning operation is susceptible to noise generated by optical and electrical systems. It is therefore difficult to attain a high positioning precision.

Furthermore, when the above three points are to be determined to determine the center of the wafer, the data of the cut-out mark must be removed in a preprocess. As a result, a long period of time is required for signal processing.

Moreover, the conventional positioning apparatuses generally use a differentiator to perform, e.g., signal processing to select a cut-out mark, as in the apparatus disclosed in Jpn. Pat. Appln. KOKOKU Publication No. 5-41017. Differentiation processing facilitates selection of a cut-out mark. However, this processing is susceptible to noise. In consideration of these points, therefore, it is difficult for the conventional apparatuses to obtain a high positioning precision.

SUMMARY OF THE INVENTION

The present invention has been made in consideration of the problems in the above conventional positioning apparatuses, and has as its object to provide a new, improved positioning apparatus and process system which are resistant to noise and can perform high-precision alignment at a high speed.

The following are the aspects of the present invention which serve to solve the above problems.

According to the first aspect, a positioning apparatus for positioning an object to be processed, which has a positioning cut-out in its peripheral portion, on a rotating table includes a detection means (e.g., constituted by a light-emitting element and a light-receiving element according to the 16th aspect, or constituted by an image pickup element such as a CCD according to the 17th aspect) for optically detecting the peripheral shape of the object, and a first arithmetic means for combining two half-cycle components of a first peripheral shape signal corresponding to one revolution (360 degrees) of the object and output from the detection means to obtain a second peripheral shape signal, the half-cycle components being shifted in phase by a half-period (180 degrees).

According to the second aspect, in addition to the first aspect, the apparatus further comprises a peak extracting means for extracting a peak portion from the peripheral shape represented by the second peripheral shape signal, and a first selection means for selecting the peak portion of the second peripheral shape signal or a portion shifted from the peak portion by a half-period (180 degrees) as a portion where the positioning cut-out is present.

In this case, according to the third aspect, the first selection means includes a means for performing product sum calculation of a predetermined evaluation pattern with respect to the peak portion of the first peripheral shape signal and a portion shifted from the peak portion by a half-period (180 degrees).

According to the fourth aspect, in addition to the first aspect, the apparatus further comprises a peak extracting means for extracting a peak portion from a peripheral shape represented by the second peripheral shape signal, and a data invalidating means for setting a predetermined range including the peak portion and a range shifted from the predetermined range by a half-period (180 degrees) as invalid data.

In this case, according to the ninth aspect, the apparatus may include a data interpolation means for performing interpolation to change the invalid data of the first peripheral shape signal, e.g., the data invalidated by the data invalidating means or data determined as invalid data in terms of data processing, into valid data on the basis of the remaining valid data.

According to the fifth aspect, in addition to the fourth aspect, the apparatus further includes a first curve approximation means, e.g., a sine or cosine wave approximation means according to the tenth aspect, for obtaining a third peripheral shape signal by performing curve approximation of the first peripheral shape signal on the basis of valid data obtained by removing the invalid data from the first peripheral shape signal.

As this sine wave approximation means, for example, according to the 11th aspect, a sine wave approximation means for performing least squares approximation of N measurement data $(\theta_i, Y_i)$ according to equation (1) representing a sine wave below is preferably used:

$$y = a \cdot \sin(\theta + \phi) + c \qquad (1)$$

(where $\phi = \tan^{-1}\{(\Sigma y_i \cos\theta_i)/(\Sigma y_i \sin\theta_i)\}$ $a = \{\Sigma y_i \sin(\theta_i + \phi)\}/\{\Sigma \sin^2(\theta_i + \phi)\}$ $c = (\Sigma y_i)/n \quad \Sigma \sin(\theta_i + \phi) = \Sigma \cos(\theta_i + \phi) = 0)$ As this cosine wave approximation means, for example, according to the 11th aspect, a cosine wave approximation means for performing least squares approximation of N measurement data $(\theta_i, Y_i)$ according to equation (2) representing a cosine wave below is preferably used:

$$y = a \cdot \cos(\theta + \phi) + c \qquad (2)$$

(where $= \tan^{-1}\{(\Sigma y_i \sin\theta_i)/\Sigma y_i \cos\theta_i)\}$ $a = \{\Sigma y_i \cos(\theta_i + \phi)\}/\{\Sigma \cos^2(\theta_i + \phi)\}$ $c = (\Sigma y_i)/n \quad \Sigma \sin(\theta_i + \phi) = \Sigma \cos(\theta_i + \phi) = 0)$ According to the sixth aspect, in addition to the fifth aspect, the apparatus further includes a second arithmetic means for obtaining the eccentricity direction and amount of the object with respect to the rotation center of the rotating table on the basis of the third peripheral shape signal, and a means (according to the 12th aspect) for setting an eccentricity magnitude EM of the object with respect to the rotation center of the table as EM=|a|, and an eccentricity direction ED as ED=$-\phi+3\pi/2$ (a>0) and ED=$-\phi+\pi/2$ (a<0). Alternatively, the apparatus includes a means for setting an eccentricity magnitude EM of the object with respect to the rotation center of the table as EM=|a|, and an eccentricity direction ED as ED=$-\phi+\pi$ (a>0) and ED=$-\phi$ (a<0).

According to the seventh aspect, in addition to the fifth aspect, the apparatus further includes a second selection means for selecting the peak portion of the second peripheral shape signal or a portion shifted from the peak portion by a half-period (180 degrees) as a portion whether the positioning cut-out is present on the basis of the first and third peripheral shape signals.

For example, according to the 13th aspect, the second selection means may be a means for obtaining the difference between the first peripheral shape signal and the third peripheral shape signal, compares the average value of the difference data of the peak portion of the second peripheral shape signal with that of the portion shifted from the peak portion by a half-period (180 degrees), and determining one of the portions, which has a higher average value as a portion where the positioning cut-out is present.

According to the eighth aspect, in addition to the seventh aspect, the apparatus further comprises a second curve approximation means for obtaining a fourth peripheral shape signal by performing curve approximation of the first peripheral shape signal corresponding to the second peripheral shape signal portion selected by the second selection means, and a third arithmetic means for obtaining the position of the center of the positioning cut-out of the object on the basis of the fourth peripheral shape signal.

For example, according to the 14th aspect, the second curve approximation means may be a means for performing least squares approximation of N measurement data $(\theta_i, Y_i)$ according to the following quadratic expression:

$$y = a_0 + a_1 x + a_2 x^2 \qquad (4)$$

For example, according to the 15th aspect, the third arithmetic means may be a means for calculating $\beta = -a_1/2a_2$ (for $dy/dx=0$)

where $\beta$ is the angle defined by the optical axis of the detection means which extends through the rotation center of the table and a straight line connecting the rotation center and a portion nearest to the cut-out according to equation (4).

In addition, according to the 18th aspect, the present invention can be applied to a multi-chamber type process system including two or more vacuum process chambers. In this case, the process chambers have at least one transfer means having a transfer arm which is movable about a fixed shaft within a predetermined range, and at least one vacuum process chamber and the positioning apparatus according to one of the 1st to 17th aspects are arranged within the drive range of the transfer arm.

In this case, according to the 19th aspect, the object is preferably positioned such that the fixed shaft is located on the extended line of a straight line connecting the center of the object placed on the rotating table of the positioning apparatus and the center of the positioning cut-out.

The positioning apparatus and the process system having the above arrangement operate as follows.

In the apparatus according to the first aspect, the detection means optically detects information about the peripheral shape of an object such as a wafer. In this case, as in the apparatus according to the 16th aspect, if the detection means is constituted by a light-emitting element and a light-receiving element, the apparatus can be simplified. In addition, if an image pickup element such as a CCD is used, as in the apparatus according to the 17th aspect, data which can be processed more easily can be obtained, and hence an increase in processing speed can be attained.

When the center of the wafer and the rotation center of the rotating table coincide with each other perfectly, since an optical signal is detected at the same position during one revolution (360 degrees), the position coordinates of the peripheral shape of the wafer are plotted as a straight line A extending in the horizontal direction, as shown in FIG. 19. Note that a projection portion (peak portion) B on the straight line A represents a cut-out, which indicates that a larger amount of light is transmitted through the portion as compared with the remaining portion.

In practice, however, since the center of the wafer is eccentric from the rotation center of the rotating table, the position coordinates of the peripheral shape of the wafer are plotted as a curve C, as shown in FIG. 20. Note that a projection portion (peak portion) D on the curve C represents a portion corresponding to the cut-out, similar to the projection portion (peak portion) B in FIG. 19, which indicates that a larger amount of light is transmitted through the portion as compared with the remaining portion.

Note that the position coordinates of the peripheral shape of the object have a period of 360° because the object is rotated on the rotating table. If the shape of an object rotated on the rotating table exhibits axial symmetry like the circular shape of a wafer, the signs of the phases of the position coordinates of the peripheral shape of the object are inverted at a period of 180 degrees, and hence the phases become substantially similar in shape at a period of 180 degrees except for the cut-out or the like.

In the apparatus according to the first aspect, therefore, the first arithmetic means combines two half-cycle components of the first peripheral shape signal representing the position coordinates of the peripheral shape of the object corresponding to one revolution (360 degrees), the half-cycle components being shifted in phase by a half-period (180 degrees), thereby obtaining second peripheral shape signals E and F with the eccentricity between the rotation center of the rotating table and the center of the wafer being canceled out, as shown in FIG. 21.

In the apparatus according to the second aspect, a peak portion is extracted from the peripheral shapes E and F of the second peripheral shape signal. As described above, this peak portion is formed when an excessive amount of light is transmitted through the wafer because of the presence of a cut-out. As shown in FIG. 20, since a peak portion D is on a curve C representing the first peripheral shape signal, it takes time to detect the peak portion. According to the apparatus of the present invention, however, the peak portion of the second peripheral shape signal can be easily detected because the eccentricity between the center of the wafer and the rotation center of the rotating table is canceled out.

The cut-out mark, i.e., the positioning cut-out, is assumed to be present at the peak portion of the second peripheral shape signal or a portion shifted from the peak portion by a half-period (180 degrees). In the apparatus according to the second aspect, therefore, one of the above portions can be selected as a cut-out mark by the selection means.

In the apparatus according-to the third aspect, product sum calculation of a predetermined evaluation pattern like the one shown in FIG. 18A, 18B, or 18C with respect to portions, in the first peripheral shape signal, where the cut-out mark is assumed to be present, i.e., the peak portion detected from the second peripheral shape signal or the portion shifted from the peak portion by a half-period (180 degrees), thereby making the difference between the cut-out mark and the remaining portion conspicuous. As a result, the cut-out mark can be easily detected.

The apparatus according to the fourth aspect is an apparatus for performing a pre-process required to obtain the eccentricity magnitude and direction of an object with respect to the rotation center of the rotating table. More specifically, a peak portion formed by the cut-out mark is unnecessary data when the eccentricity magnitude and direction of the object are to be determined from an approximate curve obtained by performing curve approximation of the peripheral shape of the object. In the apparatus according to the fourth aspect, therefore, data of the first peripheral shape signal which corresponds to a predetermined range including the peak portion obtained from the second peripheral shape signal by the peak extracting means and a range shifted from the predetermined range by a half-period (180 degrees) is invalidated by the data invalidating means to be processed as invalid data.

In this case, in this apparatus, since all candidate ranges in which the cut-out mark can be present are invalidated without specifying the position of the cut-out mark, the data processing time can be shortened. In addition, the apparatus according to the ninth aspect performs interpolation for the invalidated data portion to perform positioning with a higher precision at a higher speed.

In the apparatus according to the fifth aspect, the first curve approximation means obtains the third peripheral shape signal by performing curve approximation of the data of the first peripheral shape signal from which the invalid data is removed by the apparatus according to the fourth aspect. By performing curve approximation of the data of the first peripheral shape signal in this manner, the peripheral shape of the object can be mathematically processed to realize high-speed processing.

In performing curve approximation, if sine wave approximation is performed by the sine wave approximation means described in the 10th aspect, simple, high-speed processing can be realized. If the apparatus according to the 11th aspect performs least squares approximation of a sine wave, in particular, no pre-process of selecting specific data (e.g., selecting three representative points) from valid data need be performed, unlike the prior art.

In the apparatus according to the sixth aspect, the second arithmetic means can mathematically obtain the eccentricity direction and amount of the center of the object with respect to the rotation center of the rotating table on the basis of the peak portion (i.e., the portion representing the eccentricity direction and amount) of the peripheral shape signal having undergone curve approximation. An increase in processing speed can therefore be attained. If the apparatus according to the 12th aspect is used as the second arithmetic means, the eccentricity magnitude and direction of the wafer can be easily and directly obtained from the third peripheral shape signal having undergone sine wave approximation.

In the apparatus according to the seventh aspect, the second selection means can easily determine the position of the cut-out mark on the basis of the first, second, and third peripheral shape signals which have been used to obtain the eccentricity magnitude and direction of the wafer.

If an apparatus having a differentiator and a comparator, like the one described in the 13th aspect, is used as the second selection means, simplification of the apparatus and an increase in processing speed can be attained.

In the apparatus according to the eighth aspect, after quadratic curve approximation of the data of cutout mark candidate positions is performed by the second curve approximation means, e.g., the least squares approximation means described in the 14th aspect, the position of the cut-out mark, i.e., the central position of the cut-out mark, can be obtained by the third arithmetic means. If the apparatus according to the 15th aspect is used as the third arithmetic means, the position of the cut-out mark can be easily and directly obtained from the obtained quadratic curve.

In the conventional apparatuses, in determining the position of the cut-out mark of a wafer, after alignment of the wafer is performed with respect to the eccentricity magnitude, the position of the cut-out mark is determined to perform another alignment with respect to the cut-out mark position. That is, two steps are required for positioning. In contrast to this, according to the present invention, since the position of the cut-out mark of the wafer can be obtained on the basis of the same signal as that used to obtain the eccentricity magnitude and direction of the wafer, the wafer can be positioned in one step, thereby realizing high-speed processing.

In addition, the present invention can be effectively applied to a multi-chamber type process system, in particular, in which a wafer transfer operation is frequency performed, and hence positioning is frequency performed, and high-speed processing for these operations is required as in the apparatus according to the 18th aspect.

Furthermore, as in the apparatus according to the 19th aspect, positioning is performed such that the fixed shaft of the transfer arm is located on the extended line of a straight line connecting the center of the wafer and the center of the cut-out mark. With this operation, according to the present invention, the wafer whose eccentricity magnitude and direction and cut-out mark position are obtained can be transferred by operating the transfer arm once without performing alignment of the wafer with respect to the eccentricity magnitude and direction and alignment of the wafer with respect to the cut-out mark in two steps as in the conventional apparatuses.

According to the present invention, the eccentricity magnitude and direction of a wafer and the position of the cut-out mark can be obtained in a single step instead of a plurality of steps in calculating the eccentricity magnitude and direction of the wafer and the position of the cut-out mark as in the conventional positioning apparatuses. An increase in wafer alignment processing speed can be attained.

Moreover, according to the present invention, substantially all sampled data are used unlike the conventional apparatuses and methods in which processing is performed after sampling is performed at a plurality of points in a detection signal. Therefore, noise-resistant, high-precision alignment can be performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic plan view showing the arrangement of a multi-chamber type process system having a positioning apparatus according to an embodiment of the present invention;

FIG. 2 is a plan view showing a wafer having an orientation flat;

FIG. 3 is a plan view showing a wafer having a notch;

FIGS. 4 to 6 are schematic side views showing the structure and operation of the positioning apparatus in FIG. 1;

FIGS. 7 to 9 are views for explaining an example of signal processing executed by the positioning apparatus in FIG. 1;

FIG. 17 is a view for explaining another example of signal processing executed by the positioning apparatus in FIG. 1;

FIGS. 18A to 18C are graphs each showing an evaluation pattern used in the signal processing in FIG. 17;

FIG. 22 is a schematic plan view for explaining algorithms in the operations of the positioning apparatus and the transfer unit in FIG. 1.

DETAILED DESCRIPTION OF THE PREFERRED EMBODIMENTS

Figure 4:
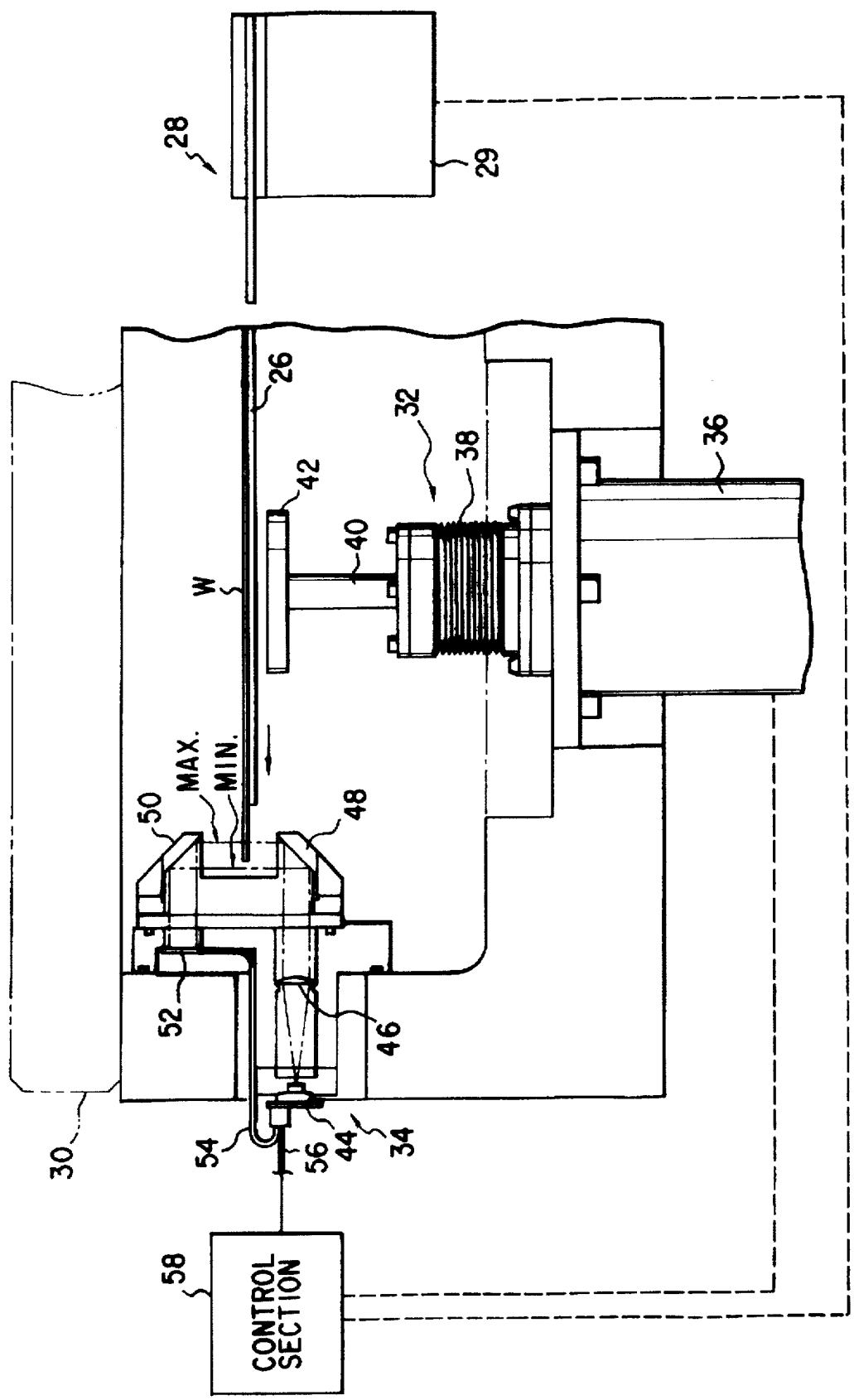

A multi-chamber type process system having a positioning apparatus according to an embodiment of the present invention and two or more vacuum process chambers will be described first with reference to the accompanying drawings.

FIG. 1 is a schematic plan view showing a vacuum process system incorporating a positioning apparatus according to an embodiment of the present invention.

As shown in FIG. 1, the vacuum process system is a multi-chamber type process system 10 in which first to fourth vacuum process chambers 4A, 4B, 4C, and 4D, first and second auxiliary vacuum chambers 6A and 6B, and first and second cassette chambers 8A and 8B are arranged in the form of a cluster around a common transfer chamber (first transfer chamber) 2.

These process chambers are accommodated in a common sub-clean room 12 to be isolated from the atmosphere. A second transfer chamber 14 is connected to the sub-clean room 12 to transfer objects to be processed between the outside and the process system 10.

The first to fourth vacuum process chambers 4A, 4B, 4C, and 4D constitute an assembly of apparatuses for consecutively performing predetermined processes for the surface of a wafer as an object to be processed. For example, the following arrangement may be applied to a process system for forming a through hole in a silicon insulating interlayer formed on the silicon of the wafer, and forming a titanium film/titanium nitride film/tungsten film as an interconnection member in the through hole:

the first vacuum process chamber 4A:
a plasma etching apparatus for forming a through hole in an insulating interlayer consisting of silicon oxide by etching;

the second vacuum process chamber 4B:
a sputtering apparatus for forming a titanium layer as an ohmic contact layer in the through hole, and also forming a titanium nitride layer as a barrier layer on the titanium layer;

the third vacuum process chamber 4C:
a CVD apparatus for forming a tungsten layer on the barrier layer; and the fourth vacuum process chamber 4D:
a plasma etching apparatus for etching back the tungsten layer formed in the through hole.

As is apparent, the above apparatus group is only an example, and the multi-chamber type process system 10 can be formed by combining various types and numbers of process chambers in accordance with required processes.

The overall arrangement of the above process system will be described below. The second transfer chamber 14 communicates with the outside via a door G1. For example, first to fourth cassette tables 16A, 1615, 16C, and 16D are arranged side by side in the second transfer chamber 14. In the case shown in FIG. 1, cassettes C1 and C2 are respectively mounted on the first and third cassette tables 16A and 16C. These cassettes C1 and C2 each serve to store and transfer a predetermined number of wafers, e.g., 24 wafers W.

A cassette transfer unit 18 is disposed in the second transfer chamber 14. The cassette transfer unit 18 can be moved parallel (in the directions indicated by the arrows in FIG. 1) to the array of the first to fourth cassette tables 16A to 16D. The cassette transfer unit 18 uses a transfer arm 18A to pick up desired cassettes storing unprocessed wafers, transfer the cassettes into the cassette chambers 8A and 8B, and recover cassettes storing processed wafers from the cassette chambers 8A and 8B.

The second transfer chamber 14 is connected to the first cassette chamber 8A via a door valve G2, and to the second cassette chamber 8B via a door valve G3. The first and second cassette chambers 8A and 8B each have a cassette stage (not shown) movable in the vertical direction. The first and second cassette chambers 8A and 8B are connected to the common transfer chamber 2 via gate valves G4 and G5, respectively.

The first and second cassette chambers 8A and 8B each have an airtight structure and exhaust and gas-supply paths (not shown). Each chamber can therefore adjust its internal atmosphere to a desired pressure atmosphere. When the door valves G2 and G3 are open (while the gate valves G4 and G5 are closed), almost the same pressure atmosphere can be set in the second transfer chamber 14 and the first and second cassette chambers 8A and 8B. In contrast to this, when the gate valves G4 and G5 are open (while the door valves G2 and G3 are closed), almost the same pressure atmosphere can be set in the common transfer chamber 2 and the first and second cassette chambers 8A and 8B.

The common transfer chamber (first transfer chamber) 2 is constituted by an airtight chamber having an almost circular plane. As described above, the common transfer chamber 2 is connected to the first and second cassette chambers 8A and 8B via the gate valves G4 and G5, and to the first to fourth vacuum chambers 4A to 4D via gate valves G6, G7, G8, and G9. These vacuum chambers 4A to 4D are, for example, the above described etching, sputtering, and CVD apparatuses. Wafers are placed/fixed on tables 20A, 20B, 20C, and 20D respectively housed in the chambers 4A to 4D to be subjected to predetermined processes. The details of the structures of these chambers will be omitted here.

The common transfer chamber (first transfer chamber) 2 is connected to the first and second auxiliary vacuum chambers 6A and 6B via communicating paths 22A and 22B, respectively. Tables 24A and 24B are respectively housed in the first and second auxiliary vacuum chambers 6A and 6B. A heating means for heating a placed wafer and a cooling means for cooling the placed wafer are mounted on each of the tables 24A and 24B so that the wafer can be heated or cooled as needed.

A transfer means 28 including a transfer arm 26 and a drive section 29 for driving the transfer arm 26 to rotate and extend/retract is disposed in almost the center of the common transfer chamber 2. The transfer arm 26 is, for example, a multijoint arm and designed to transfer predetermined wafers between the first to fourth vacuum chambers 4A to 4D, the first and second auxiliary vacuum chambers 6A and 6B, and the first and second cassette chambers 8A and 8B.

A positioning apparatus 30 for positioning a wafer as an object to be processed is disposed in the transfer chamber 2 at a position near the first and second cassette chambers 8A and 8B. The positioning apparatus 30 is mainly constituted by a rotating table unit 32 and an optical detection means 34. The details of this apparatus will be described in detail later.

The first to fourth vacuum chambers 4A to 4B and the common transfer chamber 2 each have exhaust and gas-supply paths (not shown), similar to the first and second cassette chambers 8A and 8B. With this arrangement, by opening/closing predetermined gate valves, a predetermined gas or purge gas can be introduced into each chamber via the gas-supply path, or each chamber can be controlled to a predetermined pressure atmosphere via the exhaust path.

The multi-chamber type vacuum process system 10 according to the embodiment of the present invention have the above arrangement.

In the multi-chamber type process system 10 having the above arrangement, in order to load/unload a wafer into/ from a predetermined process chamber with a high precision, the wafer W must be received by using the transfer arm 26 with a high precision. For this reason, in general, the center and cut-out mark of the wafer W transferred by the transfer arm 26 are positioned first by the positioning apparatus 30 of the present invention, and the wafer W is then received with the transfer arm 26 to be transferred into a predetermined chamber.

The arrangement of the positioning apparatus 30 will be described next with reference to FIG. 4.

The positioning apparatus 30 in FIG. 4 is mainly constituted by the rotating table unit 32 and the detection means 34.

The rotating table unit 32 comprises a drive section 36, a rotating drive shaft 40 mounted on the drive section 36 via a bellows 38, and a disk-like rotating table 42 fixed on the rotating drive shaft 40. With this arrangement, the rotating table 42 can be moved vertically by the bellows 38, and also can be rotated, by a predetermined amount, by power transmitted from the drive section 36 via the rotating drive shaft 40. Note that the outer diameter of the rotating table 42 is set to be smaller than that of the wafer W, but is preferably set to be large enough to reliably support the wafer w while it rotates. In addition, a rubber pad or electrostatic chucking pad (not shown) is mounted on the upper surface of the rotating table 42 so that the wafer W can be fixed against the centrifugal force while it rotates.

In the case shown in FIG. 4, the detection means 34 is constituted by a light-emitting portion and a light-receiving portion. The light-emitting portion is constituted by a light-emitting element 44 such as a light-emitting diode. Light emitted from the light-emitting element 44 is received by a light-receiving element 52 via a lens 46, a lower mirror 48, and an upper mirror 50, and converted into a position signal. The signal is then sent to a control section 58 via buses 54 and 56. The signal sent to the control section 58 is subjected to predetermined processes in the respective signal processing means, thereby obtaining the eccentricity magnitude and direction of the wafer and the direction of the cut-out mark. Such signal processing will be described in detail later. The control section 58 controls the operations of the transfer arm 26 and the rotating table 42 through the drive section 29 and the drive section 36 on the basis of information such as the above eccentricity magnitude and direction and the direction of cut-out mark, thereby aligning the wafer.

In the case shown in FIG. 4, the detection means 34 is constituted by the light-emitting element 44 and the light-receiving element 52. However, the present invention is not limited to this. As is apparent, for example, the peripheral portion of a wafer may be directly imaged by a CCD camera, and the resultant data may be processed as image data. If a CCD camera is used in this manner, signal data which can be processed more easily can be obtained, and an increase in processing speed can be attained.

With the above arrangement, the positioning apparatus 30 of the present invention operates in the manner shown in FIGS. 4 to 6.

More specifically, as shown in FIG. 4, the wafer W is transferred above the rotating table 42 by the transfer arm 26 while the rotating table 42 is set at a lower position.

As shown in FIG. 5, the rotating table 42 is then raised, and the wafer W is transferred onto the rotating table 42 by the transfer arm 26. Thereafter, the transfer arm 26 is retracted. The wafer W is fixed on the rotating table 42 with the rubber pad or electrostatic chucking pad (not shown). With this operation, preparation for a positioning process is completed.

Subsequently, as shown in FIG. 6, the rotating table 42 is further raised, and the rotating table 42 is rotated. In addition, light is emitted from the light-emitting element 44 and is received by the light-receiving element 52 via the lens 46, the lower mirror 48, and the upper mirror 50. In this case, the wafer W is placed on the rotating table 42 such that the periphery of the rotating wafer W crosses the optical path. By detecting light transmitted through the periphery of the wafer w (i.e., light which is not blocked by the periphery of the wafer W) while the wafer W makes one revolution, information about the peripheral portion of the wafer W can be acquired.

Figure 19:
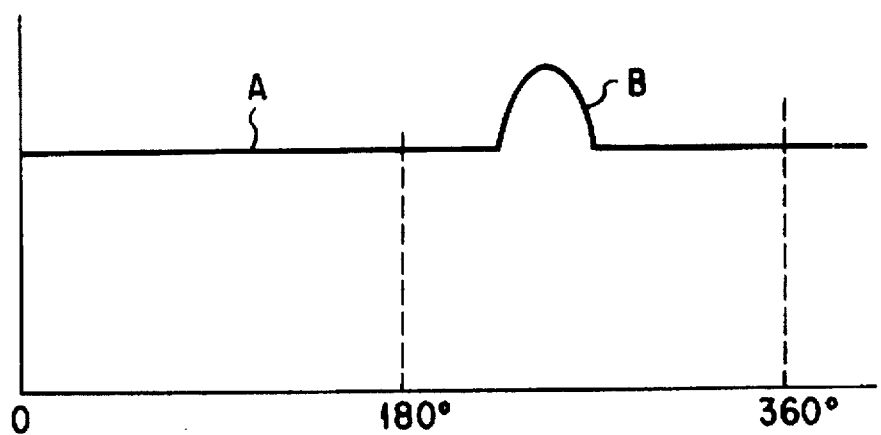
FIGS. 19 to 21 are graphs showing signal waveforms to be processed in the positioning apparatus in FIG. 1.

If the center of the wafer W coincides with the rotation center of the rotating table 42, the peripheral shape of an almost circular wafer is constant. The detected signal is therefore plotted as an almost horizontal straight line, except for a portion B corresponding to the cut-out mark which transmits light, as indicated by a solid line A in FIG. 19. In positioning the wafer W, it suffices if the position of the portion B corresponding to the cut-out mark is determined.

Figure 20:
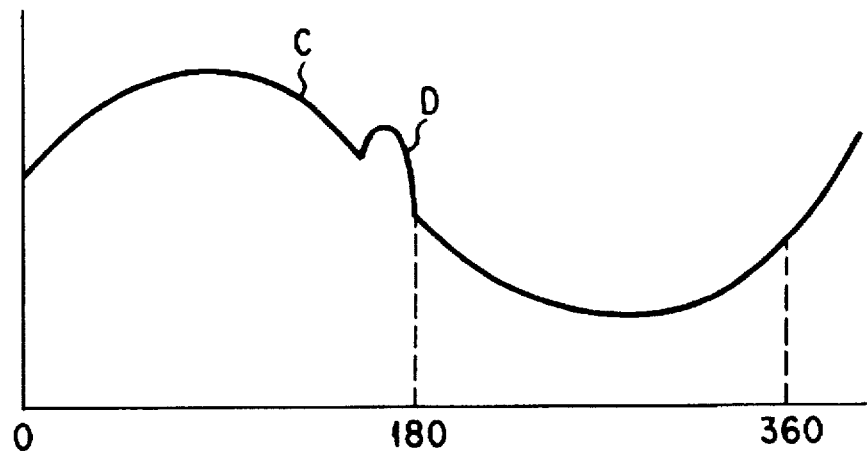
Figure 21:
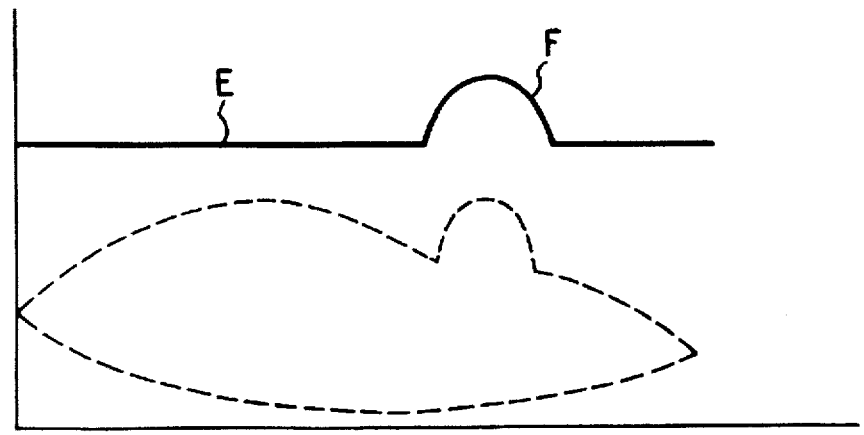

In practice, however, as shown in FIGS. 2 and 3, a center OW of the wafer W and a rotation center OP of the rotating table 42 are eccentric from each other, and hence a detected signal C is plotted as an almost sine curve, except for a portion D corresponding to the cut-out mark which transmits light, as indicated by a solid line C in FIG. 20. In positioning the wafer W, therefore, the eccentricity magnitude and direction of the center OW of the wafer W with respect to the rotation center OP of the rotating table 42 must be obtained, in addition to the detection of the position of the portion D corresponding to the cut-out mark of the wafer W.

For this reason, in the positioning apparatus 30 according to the present invention, the control section 58 is constituted by the following signal processing means.

Figure 7:
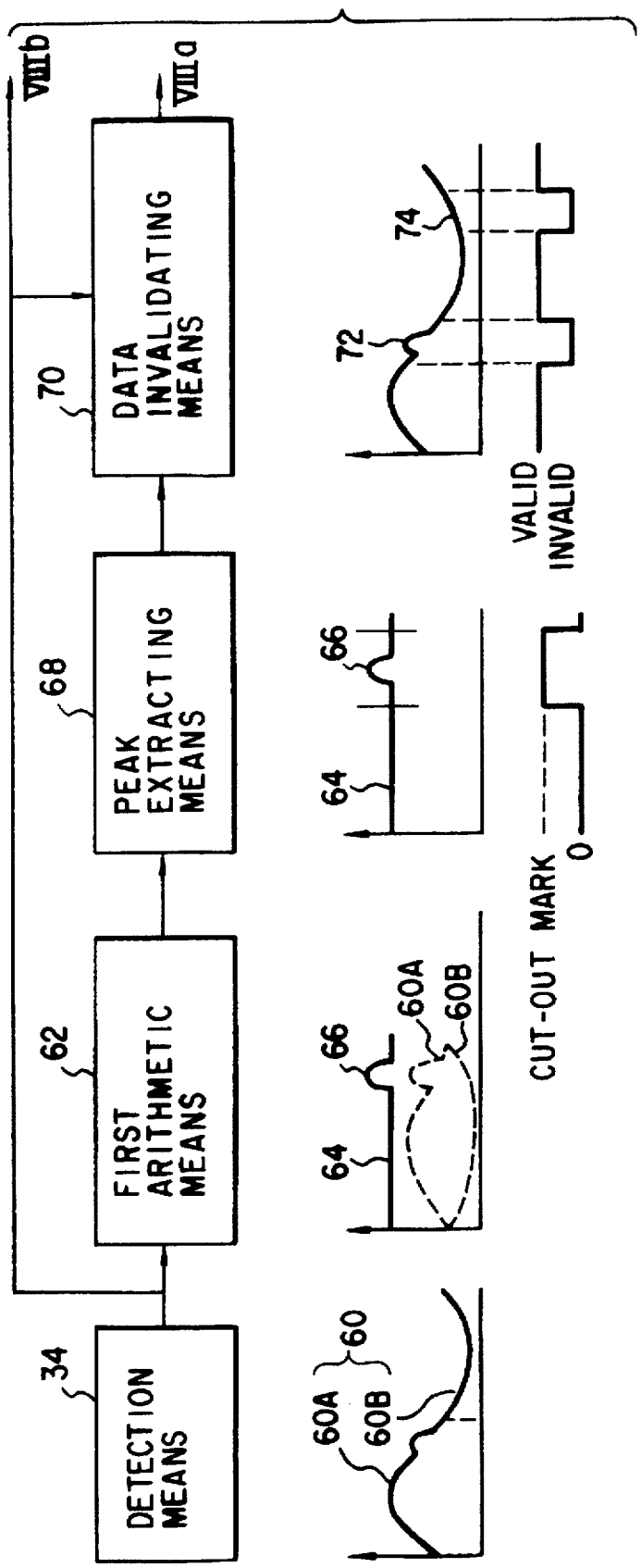

The signal processing means constituting the control section 58 will be described with reference to FIGS. 7 to 9. Referring to FIGS. 7 to 9, the graph shown below each signal processing means indicates an outline of signal processing executed by each signal processing means.

As shown in FIG. 7, the peripheral shape of the wafer W which is optically detected by the detection means 34 is sent, as a first peripheral shape signal 60 (60A, 60B), to a first arithmetic means 62.

The first arithmetic means 62 combines two half-cycle components of the first peripheral shape signal 60 (60A, 60B) corresponding to one revolution (360 degrees) of the wafer W placed on the rotating table 42 to obtain a second peripheral shape signal 64, the half-cycle components being 180 degrees out of phase. As shown in FIG. 7, in the second peripheral shape signal 64, the half-cycle curve portions that are 180 degrees apart from each other in phase cancel each other (i.e., the eccentricity of the center of the wafer W with respect to the center of the rotating table 42 is canceled out), so that only a peak portion 66 corresponding to the cut-out mark through which light is transmitted becomes conspicuous.

A peak extracting means 68 is connected to the out-put terminal of the first arithmetic means 62 for outputting the second peripheral shape signal 64. The peak extracting means 68 extracts the conspicuous peak portion 66 of the second peripheral shape signal 64. Note that the peak extracting means 68 processes the signal obtained by combining two half-cycle signal components to a half-period. Therefore, the extracted peak portion is only a cut-out mark candidate position, and the actual cut-out mark may be present at the extracted peak portion or a portion shifted from the extracted peak portion by a half-period.

A data invalidating means 70 is connected to the output terminal of the peak extracting means 68. In curve approximation processing to be described later, since a peak signal component appearing at a cut-out mark is unnecessary data, the cut-out mark signal is processed as invalid data by the data invalidating means 70. In this case, the data invalidating means 70 invalidates all cut-out mark candidate portions (i.e., a cut-out mark candidate portion 72 and a portion 74 shifted therefrom by a half-period) estimated from the peak portion extracted by the peak extracting means 68. In this manner, a procedure for selecting a portion corresponding to an actual cut-out mark from cut-out mark candidate portions is omitted to attain an increase in processing speed.

Although not shown for the sake of simple explanation, a data interpolation means for performing interpolation to change an invalidated data portion into valid data on the basis of remaining valid data can be connected to the output terminal of the peak extracting means 68.

A first curve approximation means 76 in FIG. 8 is connected to the output terminal of the data invalidating means 70. The first curve approximation means 76 performs curve approximation of the first peripheral shape signal 60 to obtain a third peripheral shape signal 78 on the basis of valid data obtained by removing the invalid data from the first peripheral shape signal 60. The first curve approximation means 76 is preferably a means for performing sine wave approximation of the first peripheral shape signal 60, and preferably uses the least squares approximation method capable of directly performing sine wave approximation on the basis of the valid data group of the first peripheral shape signal 60.

A second arithmetic means 80 is connected to the output terminal of the first curve approximation means 76. The second arithmetic means 80 obtains an eccentricity magnitude EM and eccentricity direction ED of the center of the wafer W with respect to the rotation center of the rotating table 42 from the third peripheral shape signal 78 obtained by the first curve approximation means 76 by curve approximation. As described above, according to the positioning apparatus 30 of the present invention, the eccentricity magnitude and direction of the wafer W can be directly obtained from a valid data group without performing a pre-process of selecting specific data from valid data (e.g., selecting three representative points) as in the prior art.

A second selection means 82 is connected to the output terminal of the second arithmetic means 80. As described above, the cut-out mark candidate portions (two portions) have been obtained from the second peripheral shape signal 64. However, in order to determine the cut-out mark position, a portion where the cut-out mark is actually present must be selected from the cut-out mark candidate portions. The portion where the cut-out mark is actually present is determined by the second selection means 82. In determining the portion corresponding to the cut-out mark, the difference between the first peripheral shape signal 60 and the third peripheral shape signal 78 is obtained, as indicated by a solid line 84. Thereafter, the average values of cut-out mark candidate portions 86A and 86B in difference data 84 are compared with each other to determine that the cut-out mark is present at a portion having a higher average value (the portion 86A in FIG. 8).

As shown in FIG. 9, a second curve approximation means 88 is connected to the output terminal of the second selection means 82. The second curve approximation means 88 obtains a fourth peripheral shape signal 90 by performing curve approximation of the first peripheral shape signal 60 corresponding to the cut-out mark selected by the second selection means 82. The second curve approximation means 88 preferably uses the least squares approximation method to obtain the fourth peripheral shape signal 90 by directly performing curve approximation of a valid data group as a quadratic curve. The details of this process will be described later.

A third arithmetic means 92 is connected to the output terminal of the second curve approximation means 88. The third arithmetic means 92 directly obtains a nearest portion Nc or Fc with respect to the rotation center of the rotating table 42 on the basis of the peak value of the fourth peripheral shape signal 90 obtained by the second curve approximation means 88.

The positioning apparatus of the present invention can simultaneously obtain the eccentricity magnitude and direction of the center of the wafer W with respect to the center of the rotating table 42 and the position of the cut-out mark of the wafer W by a series of signal processing.

Unlike the conventional apparatuses, therefore, the apparatus of the present invention need not perform positioning of the center of the wafer W and the cut-out mark of the wafer W in two steps, but can perform such processing in one step, thereby realizing high-speed positioning of the wafer W.

In this case, unlike the conventional apparatuses, the apparatus of the present invention directly processes a valid data group sampled by the detection means to obtain the eccentricity magnitude and direction of the wafer W and the position of the cut-out mark of the wafer W without selecting representative points from the valid data group. A further increase in processing speed can therefore be attained.

Algorithms used by the positioning apparatus: of the present invention to perform positioning of the center and a cut-out mark of the wafer W will be described next with reference to FIGS. 10 to 13. [Pre-process and search for cut-out mark candidate positions]

Figure 10:
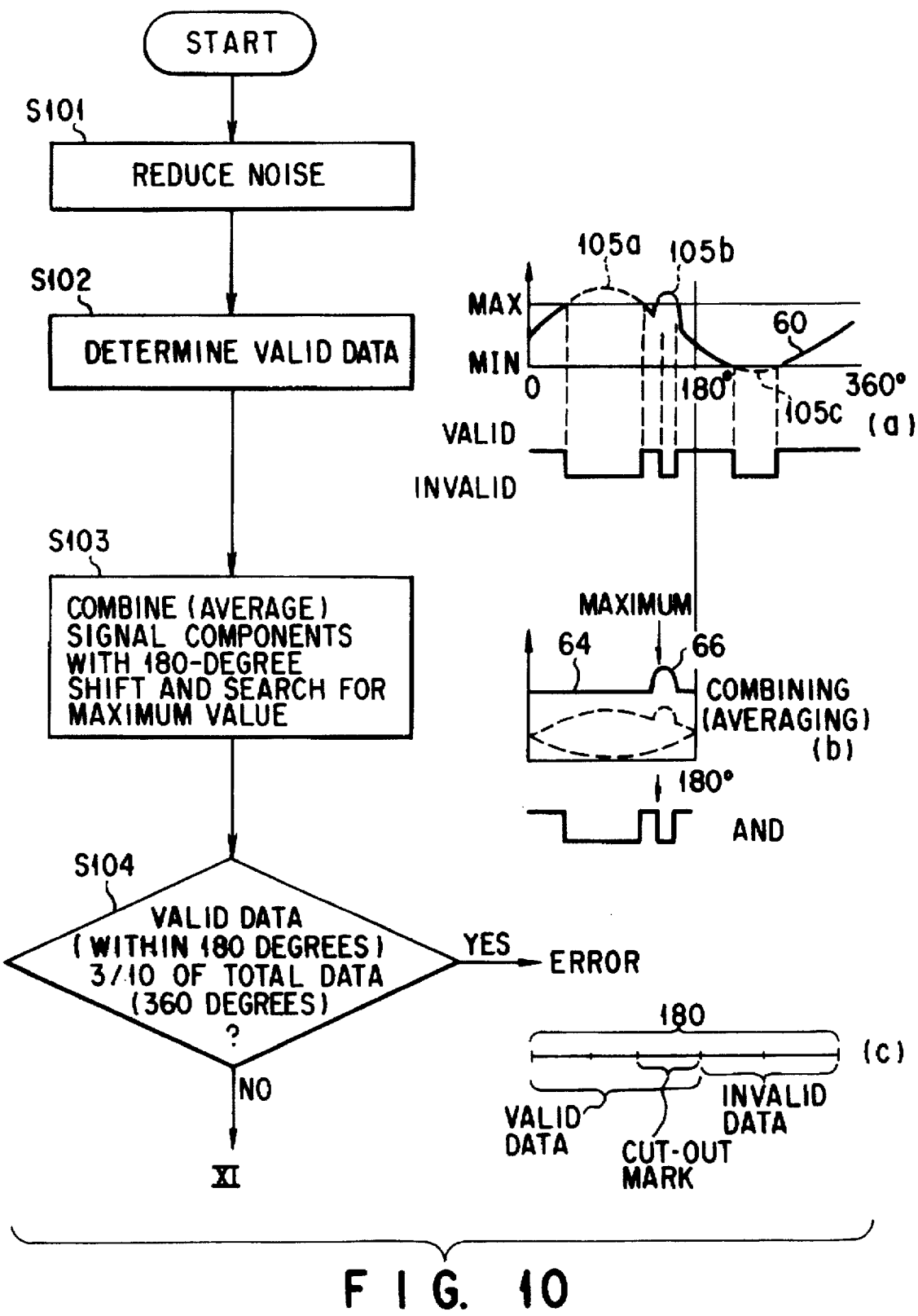
FIGS. 10 to 13 are flow charts showing algorithms in the respective steps in the signal processing in FIGS. 7 to 9.

As shown in FIG. 10, in step S101, noise is removed from data representing the peripheral shape of the wafer W which is sampled by the detection means 34. In removing this noise, for example, average values at five adjacent sampling points are obtained. If the data at a given portion is larger than the average values at portions before and after the given portion by a predetermined value, it is determined that noise is contained in the given portion. The data of the given portion is then invalidated.

The flow advances to step S102 to determine valid data. Generally, as shown in FIG. 4, the optical detection means 34 measures the peripheral shape of the wafer W with a light beam having a certain width (indicated by the dotted lines in FIG. 4). For this reason, if the eccentricity magnitude of the wafer W with respect to the rotating table 42 is large, and the locus of the periphery of the wafer w exceeds the maximum value (Max) and minimum value (Min) of the light beam, effective sampling cannot be performed at portions 105a, 105b, and 105c indicated by the dotted lines at "(a)" in FIG. 10. For this reason, in step S102, a pre-process of invalidating the data of the above portion is performed.

In step S103, the first arithmetic means 62 obtains the second peripheral shape signal 64 by combining two half-cycle components, of the first peripheral shape signal 60 sampled by the detection means 34, that are 180 degrees out of phase. The peak extracting means 68 extracts the peak portion 66 of the second peripheral shape signal 64 ("(b)" in FIG. 10).

The flow advances to step S104 to determine the ratio of valid data. If, for example, the valid data is less than 3/10 the sampled data corresponding to one revolution (360 degrees) (i.e., the valid data is less than 3/5 the combined half-cycle data corresponding to a half revolution (180 degrees, as indicated by "(c)" in FIG. 10), an error signal indicating that valid alignment processing cannot be performed is output. With this operation, a command to place the wafer w on the rotating table 42 again with the transfer arm 26 can be sent.

As is apparent, the criterion for determining valid data is not limited to the above case and can be set to an arbitrary numeric value in accordance with a required precision.

In this embodiment, after the second peripheral shape signal 64 is obtained by the first arithmetic means 62, a sampled data error is determined. However, the embodiment may use an arrangement for performing determination of a sampled data error on the basis of a proper reference value when valid data determination is performed in step S102.

Figure 11:
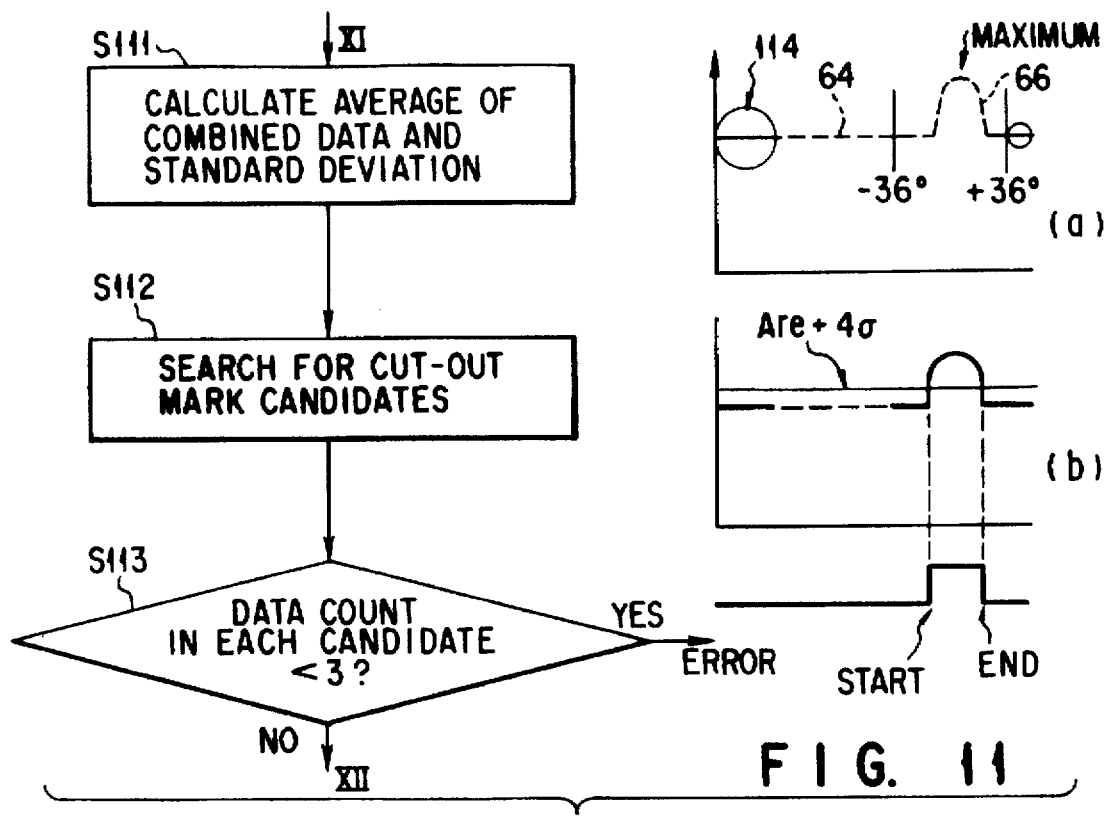

The flow then advances to step S111 in FIG. 11 to calculate the average value and standard deviation of the data combined in step S103. In this case, target data is valid data (an encircled portion 114 indicated by "(a)" in FIG. 11) excluding the range of ±36 degrees from the position of the peak value (maximum value) detected in step S103. Assume that an orientation flat like the one shown in FIG. 2 is used as a cut-out mark. In this case, since the orientation flat is generally designed to fall within the range of 36 degrees of the entire periphery of the wafer W, it is assumed even in consideration of a maximum error that the cut-out mark is present within the range of q36 from the peak portion 66. A high-precision average value and standard deviation can therefore be obtained by processing the valid data excluding that portion.

The flow advances to step S112 to search for cut-out mark candidate positions. In this case, it can be determined that a cut-out mark candidate is present at a portion exceeding the average value, (Ave.)+4σ, of the combined data as a threshold. In this case, the term "cut-out mark candidate position" is used instead of "cut-out mark position" because the target data in step S112 is combined data corresponding to a half revolution, i.e., the actual cut-out mark may be present at a portion where it is determined by the processing that the cut-out mark is present, or at a portion shifted therefrom by a half revolution (180 degrees).

The flow then advances to step S113 to determine whether the number of data present at the cut-out mark candidate portion is less than three. This determination processing is performed because parabola approximation based on a quadratic expression is performed in the subsequent processing on the basis of sampled data contained in the cut-out mark portion, and this approximation requires data about at least three points. If, therefore, the number of data present at the cut-out mark candidate portion is less than three, an error signal is output because it is difficult to specify a cut-out mark portion.

[Calculation of eccentricity magnitude and direction of wafer w]

Figure 12:
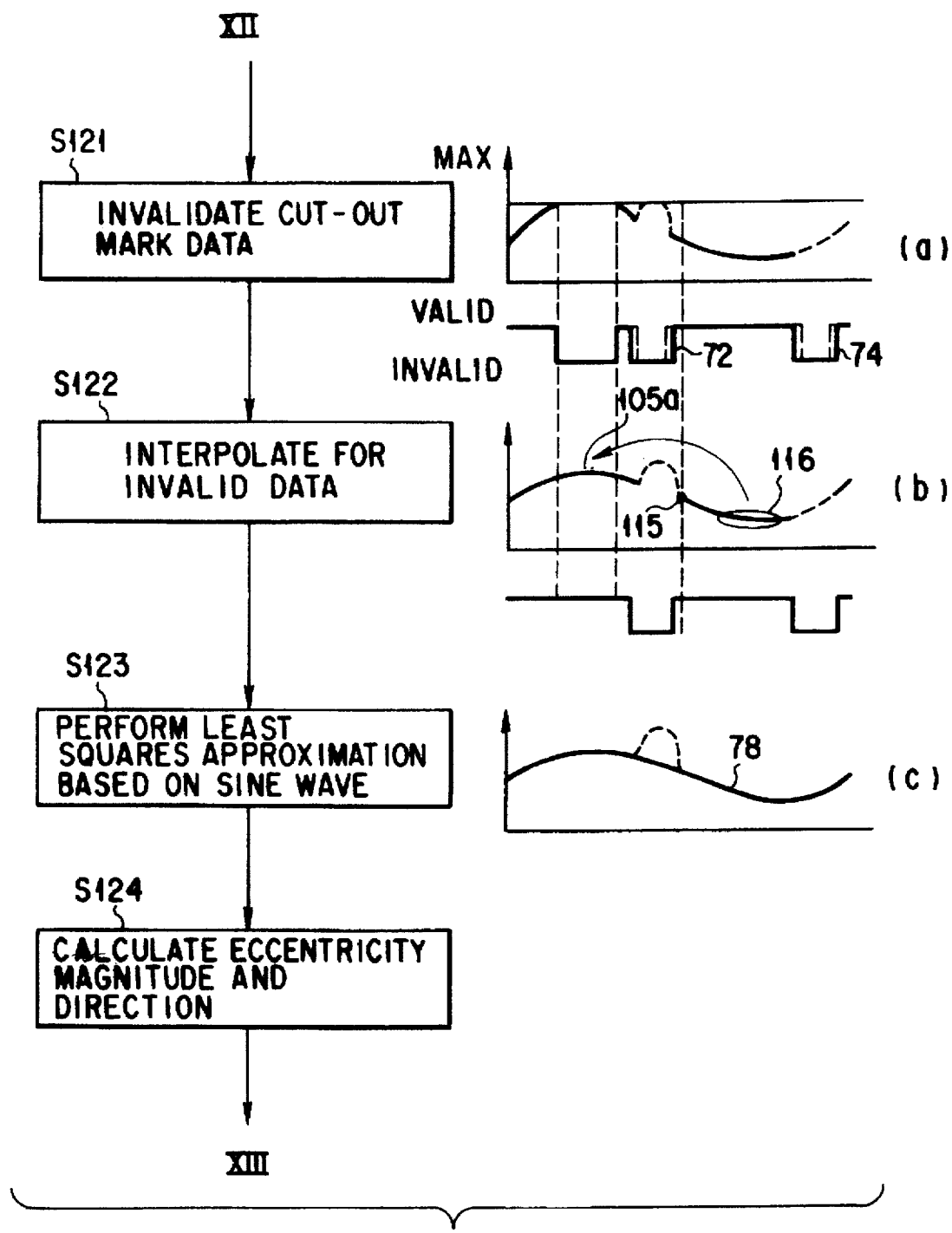

After the above pre-process is completed, an algorithm for calculation processing of the eccentricity magnitude and direction of the wafer W is started, as shown in FIG. 12.

In the positioning apparatus 30 of the present invention, when the eccentricity magnitude and direction of the wafer w are to be obtained, the first curve approximation means 76 performs sine wave approximation of the first peripheral shape signal 60. In this case, cut-out mark data must be removed in advance because it may cause deterioration in curve approximation precision.

In step S121, therefore, the data invalidating means 70 invalidates data contained in cut-out mark candidate portions (portions 72 and 74 indicated by "(a)" in FIG. 12). The following are the sampled data which have been invalidated in the above processing:

- the portion determined as noise in step S101;
- the portion determined to exceed the detection limit of the detection means 34 in step S102; and the portions determined as cut-out mark candidate positions, in step S112, which are shifted from each other by a half revolution (180 degrees).

Curve approximation of the first peripheral shape signal 60 is performed on the basis of the valid data selected in the above steps. Prior to this processing, interpolation for the invalid data can be performed in step S122.

More specifically, since the wafer W has an almost circular plane, the first peripheral shape signal 60 detected by the detection means 34 appears as a point-symmetrical pattern having its center at a point 115 corresponding to 180 degrees, as indicated by "(b)" in FIG. 12. If, therefore, a region (an encircled region 116 at "(b)" in FIG. 12) shifted from a data region 105a, which has been determined as invalid data in step S102, by a half revolution (180 degrees) is left as valid data, the data region 105a can be subjected to interpolation on the basis of the data contained in the data region 116.

As is apparent, this data interpolation processing is not always required, and may be omitted to increase the processing speed.

After the above processing is completed, the flow advances to step S123, in which the first curve approximation means 76 performs sine or cosine wave approximation. In this case, in the positioning apparatus of the present invention, since the least squares method is used to perform sine or cosine wave approximation processing, the eccentricity magnitude and direction of the wafer W can be directly obtained from the valid data group. The apparatus of the present invention need not perform a pre-process such as selection of representative points from valid data to obtain an eccentricity magnitude and direction as in the conventional apparatuses.

A method of performing least squares approximation of N measurement data ($\theta_i$, $Y_i$) according to equation (1) representing a sine wave:

$$y = a \cdot \sin(\theta + \phi) + c \quad (1)$$

where $\phi = \tan^{-1}\{(\Sigma y_i \cos\theta_i)/(\Sigma y_i \sin\theta_i)\}$ $a = \{\Sigma y_i \sin(\theta_i + \phi)\}/\{\Sigma \sin^2(\theta_i + \phi)\}$ $c = (\Sigma y_i)/n$  $\Sigma \sin(\theta_i + \phi) = \Sigma \cos(\theta_i + \phi) = 0$)

will be described below. In accordance with the above-mentioned provision, data to be subjected to sine wave approximation must be a set of four data that are 90 degrees or $\pi/2$ apart.

Note that a cosine wave is represented by equation (2):

$$y = a \cdot \cos(\theta + \phi) + c \quad (2)$$

(where $\phi = \tan^{-1}\{(\Sigma y_i \sin\theta_i)/(\Sigma y_i \cos\theta_i)\}$ $a = \{\Sigma y_i \cos(\theta_i + \phi)\}/\{\Sigma \cos^2(\theta_i + \phi)\}$ $c = (\Sigma y_i)/n$  $\Sigma \sin(\theta_i + \phi) = \Sigma \cos(\theta_i + \phi) = 0$)

In cosine wave approximation as well, the eccentricity magnitude and direction of the wafer W are obtained according equation (2) in almost the same procedure as in since wave approximation. The detailed description of this procedure will therefore be omitted.

In the least squares method, values a, $\phi$, and c which set the following equation at minimum are obtained:

$$S = \sum_{i=1}^{N} (y_i - y)^2$$

$$= \sum_{i=1}^{N} \{y_i - a \cdot \sin(\theta_i + \phi) - c\}^2$$

In this specification, "$\Sigma$" generically indicates $$\sum_{i=1}^{N},$$

unless specified otherwise.

The above equation can be modified as follows:

$$S = \Sigma\{y_i^2 - 2y_i a \cdot \sin(\theta_i+\phi) - 2y_i c + a^2\sin^2(\theta_i+\phi) + 2ca\cdot\sin(\theta_i+\phi) + c^2\} \quad (3)$$

Differentiating equation (3) with respect to $\phi$ yields $$\frac{\partial s}{\partial \phi} = \Sigma\{-2y_i a \cdot \cos(\theta_i + \phi) + 2a^2\sin(\theta_i + \phi)\cos(\theta_i + \phi) + 2ca \cdot \cos(\theta_i + \phi)\}$$

$$= -2a\Sigma y_i\cos(\theta_i + \phi) + a^2\Sigma\sin2(\theta_i + \phi) + 2ca\Sigma\cos(\theta_i + \phi)$$

In this case, if $\theta_i$ of the measurement data is selected to obtain a set of four data that are shifted by $\pi/2$, the second and third terms become 0, and hence $$\frac{\partial s}{\partial \phi} = -2a\Sigma y_i\cos(\theta_i + \phi)$$

$$= -2a(\Sigma y_i\cos\theta_i\cos\phi - \Sigma y_i\sin\theta_i\sin\phi)$$

$$= -2a(\cos\phi\Sigma y_i\cos\theta_i - \sin\phi\Sigma y_i\sin\theta_i)$$

At the minimum point, since $\partial s/\partial \phi = 0$, $\cos\phi\Sigma y_i\cos\theta_i = \sin\phi\Sigma y_i\sin\theta_i$ $$\tan\phi = \frac{\sin\phi}{\cos\phi} = \frac{\Sigma y_i\cos\theta_i}{\Sigma y_i\sin\theta_i}$$

therefore, $$\phi = \tan^{-1}\frac{\Sigma y_i\cos\theta_i}{\Sigma y_i\sin\theta_i}$$

Differentiating equation (3) with respect to a gives $$\frac{\partial s}{\partial \phi} = \Sigma\{-2y_i\sin(\theta_i + \phi) + 2a \cdot \sin^2(\theta_i + \phi) + 2c\sin(\theta_i + \phi)\}$$

$$= -2\Sigma y_i\sin(\theta_i + \phi) + 2a\Sigma\sin^2(\theta_i + \phi) + 2c\Sigma\sin(\theta_i + \phi)$$

Since third term is 0 because of the above $\theta_i$ condition, $\partial s/\partial\phi = -2\Sigma y_i \sin(\theta_i + \phi) + 2a\Sigma \sin^2(\theta_i + \phi)$ At the minimum point, since $\partial s/\partial\phi = 0$, $\Sigma y_i \sin(\theta_i + \phi) = a\Sigma \sin^2(\theta_i + \phi)$ therefore, $$a = \frac{\Sigma y_i \sin(\theta_i + \phi)}{\Sigma \sin^2(\theta_i + \phi)}$$

In this case, since $\theta_i$ of the measurement data is a set of four data that are shifted by $\pi/2$, $$\Sigma \sin^2(\theta_i + \phi) = \sum_{i=1}^{N/4} \{\sin^2(\theta_i + \phi) + \sin^2(\theta_i + \phi + \pi/2) +$$

$$\sin^2(\theta_i + \phi + \pi) + \sin^2(\theta_i + \phi + 3\pi/2)\}$$

$$= \sum_{i=1}^{N/4} \{\sin^2(\theta_i + \phi) + \cos^2(\theta_i + \phi) +$$

$$\sin^2(\theta_i + \phi + \pi) + \cos^2(\theta_i + \phi + \pi)\}$$

$$= \sum_{i=1}^{N/4} 2 = N/2$$

therefore, $$a = \frac{\Sigma y_i \sin(\theta_i + \phi)}{\Sigma \sin^2(\theta_i + \phi)} = \frac{\Sigma y_i \sin(\theta_i + \phi)}{N/2}$$

Differentiating equation (3) with respect to c, we have $$\frac{\partial s}{\partial \phi} = \Sigma\{-2y_i + 2a \cdot \sin(\theta_i + \phi) + 2c\}$$

$$= -2\Sigma y_i + 2a\Sigma \sin(\theta_i + \phi) + 2c\Sigma 1$$

Since the second term is 0 because of the above $\theta_i$ condition, $$\partial s/\partial \phi = -2\Sigma y_i + 2c\Sigma 1$$

At the minimum point, since $\partial s/\partial \phi = 0$, $$\Sigma y_i = c\Sigma 1$$

therefore, $$c = \frac{\Sigma y_i}{\Sigma 1} = \frac{\Sigma y_i}{N}$$

After the first curve approximation means 76 obtains the third peripheral shape signal 78 by performing sine wave approximation of the first peripheral shape signal 60 in the above manner, the flow advances to step S124. According to the present invention, in the above sine wave approximation expressions, the eccentricity magnitude EM and eccentricity direction ED of the center of the wafer W with respect to the rotation center of the rotating table 42 can be given by $M=|a|=$, $ED=-\phi+3\pi/2$ ($a>0$), and $ED=-\phi+\pi/2$ ($a<0$), respectively. The eccentricity magnitude and direction can therefore be easily obtained.

[Calculation of cut-out mark direction]

The flow further advances to calculation processing of a cut-out mark direction. An algorithm for calculating a cut-out mark direction will be described below with reference to FIG. 13.

In step S131, the second selection means 82 selects a cut-out mark position. As described above, the candidate portions (the two portions with a phase shift of 180 degrees) where the cut-out mark may be present have been identified by the second peripheral shape signal 64 in step S112. In calculating a cut-out mark direction, a portion where the cut-out mark is actually present must be selected from these cut-out mark candidate portions.

Figure 13:
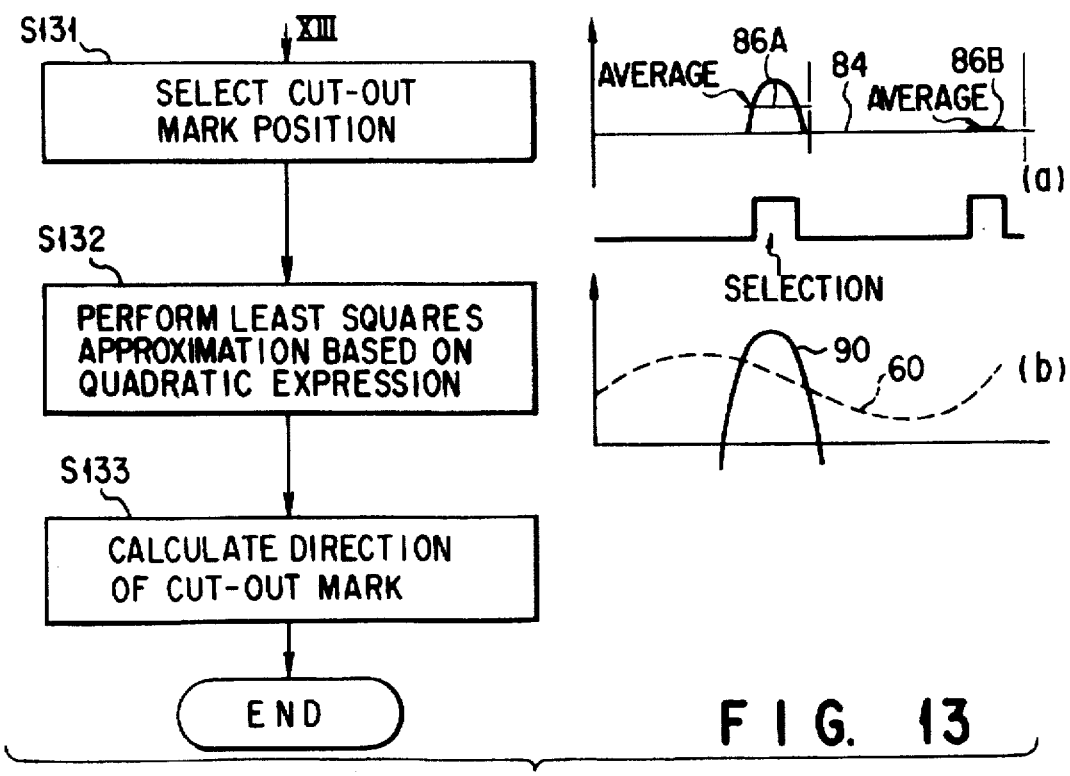

In step S131, as indicated by "(a)" in FIG. 13, the difference between the first peripheral shape signal 60 obtained in step S102 and the third peripheral shape signal 78 obtained in step S123 is obtained. The third peripheral shape signal 78 is obtained by curve approximation of the portion obtained by removing the orientation flat portion from the first peripheral shape signal 60. The obtained difference therefore exhibits an almost horizontal straight line, from which a portion 86A where the orientation flat is actually present is removed, as indicated by a solid line at "(a)" in FIG. 13. If the average values (86A, 86B) of the orientation flat candidate portions, of the above difference, obtained in step S112 are compared with each other, it can be determined that the orientation flat portion is actually present in a portion having a higher average value (86A in FIG. 13).

After the orientation flat portion 86A is determined, the flow advances to step S132, in which the second curve approximation means 88 performs parabola approximation. In this case, in the positioning apparatus of the present invention, since parabola approximation processing based on the least squares method is performed, the orientation flat direction can be directly obtained from the valid data group.

A method of performing least squares approximation of N measurement data $(\theta_i, Y_i)$ by using the following quadratic expression will be described below:

$$y = a_0 + a_1 x + a_2 x^2 \quad (4)$$

In this case, the least squares method is used to obtain values $a_0$, $a_1$, and $a_2$ which minimize the following value:

$$S = \Sigma (y_i - y)^2 \quad (5)$$

$$= \Sigma (y_i - a_0 - a_1 x_i - a_2 x_i^2)^2$$

Differentiating equation (5) with respect to $a_0$, $a_1$, and $a_2$ yields $$\frac{\partial s}{\partial a_0} = \frac{\partial}{\partial a_0} \Sigma \{(y_i - a_1 x_i - a_2 x_i^2) - a_0\}^2$$

$$= \frac{\partial}{\partial a_0} \Sigma \{(y_i - a_1 x_i - a_2 x_i^2)^2 -$$

$$2a_0(y_i - a_1 x_i - a_2 x_i^2) + a_0^2\}$$

$$= \Sigma\{-2(y_i - a_1 x_i - a_2 x_i^2) + 2a_0\}$$

$$= 2(-\Sigma y_i + a_0 \Sigma 1 + a_1 \Sigma x_i + a_2 \Sigma x_i^2)$$

$$\frac{\partial s}{\partial a_1} = \frac{\partial}{\partial a_1} \Sigma \{(y_i - a_0 - a_2 x_i^2) - a_1 x_i\}^2$$

$$= \frac{\partial}{\partial a_0} \Sigma \{(y_i - a_0 - a_2 x_i^2)^2 -$$

$$2a_1 x_i (y_i - a_0 - a_2 x_i^2) + a_1^2 x_i^2\}$$

$$= \Sigma\{-2x_i(y_i - a_0 - a_2 x_i^2) + 2a_1 x_i^2\}$$

$$= 2(-\Sigma x_i y_i + a_0 \Sigma x_i + a_1 \Sigma x_i^2 + a_2 \Sigma x_i^3)$$

$$\frac{\partial s}{\partial a_2} = \frac{\partial}{\partial a_2} \Sigma \{(y_i - a_0 - a_1 x_i) - a_2 x_i^2\}^2$$

$$= \frac{\partial}{\partial a_2} \Sigma \{(y_i - a_0 - a_1 x_i)^2 -$$

$$2a_2 x_i^2 (y_i - a_0 - a_1 x_i) + a_2^2 x_i^4\}$$

$$= \Sigma\{-2x_i^2(y_i - a_0 - a_1 x_i) + 2a_2 x_i^4\}$$

$$= 2(-\Sigma x_i^2 y_i + a_0 \Sigma x_i^2 + a_1 \Sigma x_i^3 + a_2 \Sigma x_i^4)$$

At the minimum point, since $\partial s/\partial a_0 = \partial s/\partial a_1 = \partial s/\partial a_2 = 0$, $$\Sigma y_i = a_0 \Sigma 1 + a_1 \Sigma x_i + a_2 \Sigma x_i^2$$

$\Sigma x_i y_i = a_0 \Sigma x_i + a_1 \Sigma x_i^2 + a_2 \Sigma x_i^3$ $\Sigma x_i^2 y_i = a_0 \Sigma x_i^2 + a_1 \Sigma x_i^3 + a_2 \Sigma x_i^4$ The above equations can be expressed by the following matrix $$\begin{pmatrix} \Sigma y_i \\ \Sigma x_i y_i \\ \Sigma x_i^2 y_i \end{pmatrix} = \begin{pmatrix} \Sigma 1 & \Sigma x_i & \Sigma x_i^2 \\ \Sigma x_i & \Sigma x_i^2 & \Sigma x_i^3 \\ \Sigma x_i^2 & \Sigma x_i^3 & \Sigma x_i^4 \end{pmatrix} \begin{pmatrix} a_0 \\ a_1 \\ a_2 \end{pmatrix}$$

therefore, $$\begin{pmatrix} a_0 \\ a_1 \\ a_2 \end{pmatrix} = \begin{pmatrix} \Sigma 1 & \Sigma x_i & \Sigma x_i^2 \\ \Sigma x_i & \Sigma x_i^2 & \Sigma x_i^3 \\ \Sigma x_i^2 & \Sigma x_i^3 & \Sigma x_i^4 \end{pmatrix}^{-1} \begin{pmatrix} \Sigma y_i \\ \Sigma x_i y_i \\ \Sigma x_i^2 y_i \end{pmatrix}$$

After the second curve approximation means 88 obtains the fourth peripheral shape signal 90 by performing parabola approximation of the signal component corresponding to the cut-out mark in the above manner, the flow advances to step S133. According to the present invention, the drive section 29 obtains $\beta = -a_1/2a_2$ (for $dy/dx=0$)

according to the above parabola approximation expression to obtain a cut-out mark direction. In this case, β represents the angle defined by the optical axis of the detection means 34 which extends through the rotation center OP of the rotating table and the straight line connecting the rotation center OP and the nearest portion Nc or Fc with respect to the cut-out mark.

Note that the cut-out mark direction slightly changes its meaning depending on whether the cut-out mark is an orientation flat or a notch. When the cut-out mark is an orientation flat, the cut-out mark direction does not always indicate the direction from the rotation center OP of the rotating table to the center of the orientation flat, but indicates the direction of a normal dropped from the rotation center to the orientation flat. This point will be described in detail below with reference to FIG. 22. Referring to FIG. 22, the reference symbols have the following means:

OP: rotation center of rotating table

OR: rotation center of transfer arm

OWc: wafer center before correction

Owe: wafer center after correction

Fc: portion nearest to orientation flat before correction

Fe: portion nearest to orientation flat after correction

Nc: portion nearest to notch before correction

Ne: portion nearest to notch after correction d: eccentricity magnitude

α: eccentricity direction angle

β: cut-out mark direction angle $\theta_a$: direction correction angle of wafer $\theta_b$: rotation correction angle of transfer arm Rx: extension/retraction correction amount of transfer arm When the cut-out mark is a notch, congruent triangles ΔNc·OP·OWc and ΔNe·OP·OWe are considered before and after correction. After correction, points Ne, OWe, and OR are aligned on a straight line, and a triangle ΔOP·OWe·OR is formed. If ∠OP·OWe·OR=t, then $$\begin{aligned} t &= \angle Ne \cdot OP \cdot OWe + \angle OP \cdot Ne \cdot OWe \\ &= \angle Nc \cdot OP \cdot Owc + \angle OP \cdot Nc \cdot OWe \\ &= \alpha - \beta + \sin^{-1}\{(d/m)\sin(\alpha - \beta)\} \end{aligned} \quad (6)$$

For the triangle ΔOP·OWe·OR $r \sin \theta_b = d \sin t$ therefore, $\theta_b = \sin^{-1}\{(d/r)\sin t\}$ $R_x = n - r = r \cos \theta_b + d \cos t - r$ $\alpha + \theta_a = t + \theta_b$ $\theta_a = t + \theta_b - \alpha$ When the cut-out mark is an orientation flat, a straight line Ne·OWe and a straight line Fe·OP are parallel to each other. For this reason, it suffices if ∠ΔOP·Nc·OWc=0 and t=α−β in equation (6).

When a wafer is to be received while the direction of the cut-out mark is rotated clockwise by an angle φ with respect to a straight line connecting the rotation center OR of the transfer arm and the center of the wafer W, as shown with a half of a wafer indicated by the alternate long and short dashed lines in FIG. 22, it suffices if equation (6) is rewritten as follows:

$t = \angle Ne \cdot OP \cdot OWe + \angle OP \cdot Ne \cdot OWe + \phi$

A series of processing operations performed by the positioning apparatus of the present invention is completed in the above manner. As described above, according to the present invention, the eccentricity magnitude and direction of the center of the wafer W with respect to the center of the rotating table 42 and the position of the cut-out mark of the wafer W can be simultaneously obtained by a series of processing operations.

Unlike the conventional apparatuses, therefore, the apparatus of the present invention need not perform positioning of the center of the wafer W and the position of the cut-out mark of the wafer W in two steps, but can perform such processing in one step, thereby realizing high-speed positioning processing of the wafer W.

In addition, unlike the conventional apparatuses, the apparatus of the present invention can obtain the eccentricity magnitude and direction of the wafer W and the position of the cut-out mark of the wafer W by directly processing a valid data group sampled by the detection means without selecting representative points from the valid data group, thereby further increasing the processing speed.

A series of operations to be performed when the transfer arm 26 receives the wafer W whose eccentricity magnitude and direction with respect to the center of the rotating table 42 and cut-out mark position are obtained by the positioning apparatus of the present invention will be described next with reference to FIG. 14.

Figure 16:
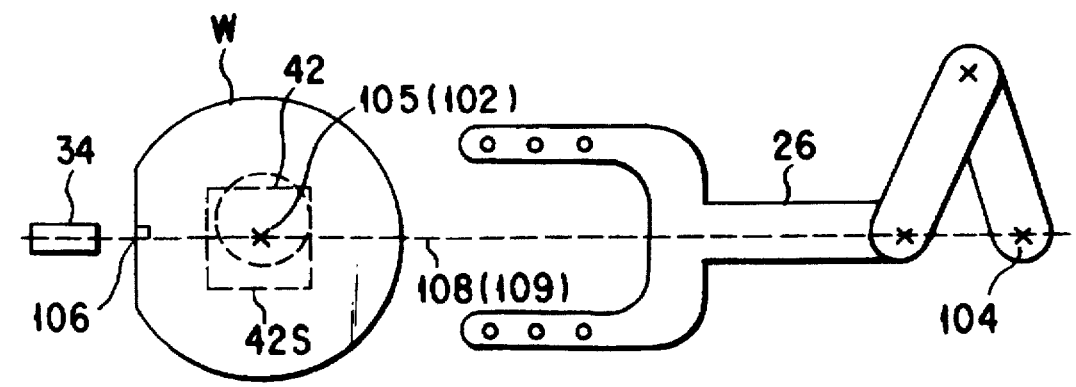
FIG. 16 is a schematic plan view showing the operations of a conventional positioning apparatus and a transfer unit.

The operation of a conventional positioning apparatus will be described first with reference to FIG. 16.

A general conventional positioning apparatus has an X-Y slider 42s for supporting a wafer W placed on a rotating table 42. In positioning the wafer W, the rotating table 42 is rotated, and the X-Y slider 42s is driven to correct the eccentricity of a center 102 of the wafer with respect to a predetermined center 105 of the extended position of the transfer arm 26. In this case, correction is performed such that a center 106 of the cut-out mark is located on a central line 109 in the extended direction of the transfer arm 26. The transfer arm 26 is then moved along the central line 109 to receive the wafer W.

In this case, according to the conventional positioning apparatus, since the eccentricity between the center 105 of the extending position of the transfer arm 26 and the center 102 of the wafer W is corrected in advance in the first step, a straight line 108 connecting the center 102 of the wafer W and the cut-out mark center 106 almost coincides with the central line 109 crossing a fixed shaft 104 of the transfer arm 26 and the center 105 of the extended position. Therefore, the wafer can be accurately received by moving the transfer arm 26 along the central line 109.

Figure 15:
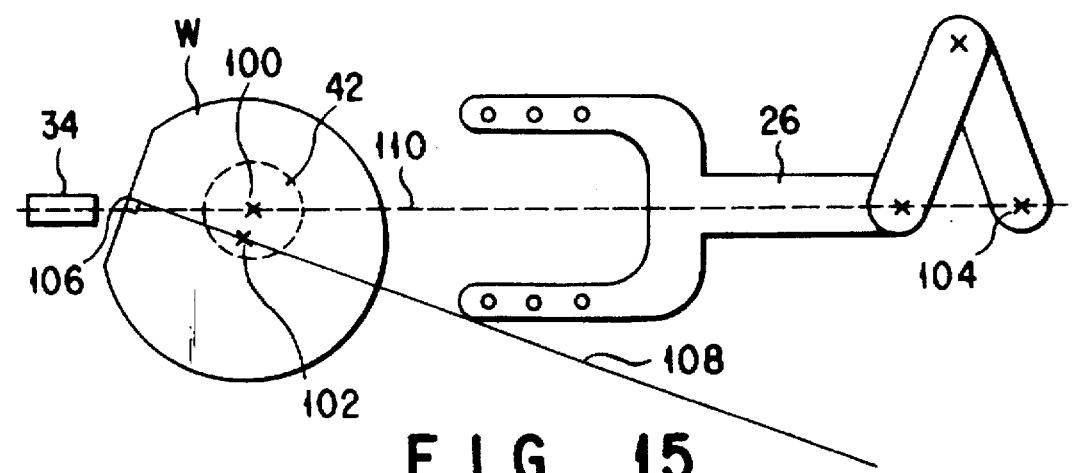

In contrast to this, according to the positioning apparatus of the present invention, the wafer W can be accurately received by the transfer arm 26 without setting the X-Y slider on the rotating table 42. More specifically, the wafer W can be accurately received by the transfer arm 26 while the center 102 of the wafer W remains eccentric from a rotation center 100 of the rotating table 42. However, while the center 102 of the wafer W is eccentric from the rotation center 100 of the rotating table 42, the straight line 108 connecting the center 102 of the wafer W and the cut-out mark center 106 cannot be made to coincide with a straight line 110 connecting the center of the rotating table 42 and the fixed shaft 104 of the transfer arm 26. For this reason, as shown in FIG. 15, the wafer w cannot be received by the transfer arm 26 accurately (i.e., in such a manner the approach line of the transfer arm 26 coincides with the straight line 108 connecting the cut-out mark center 106 of the wafer W and the center 102) by simply aligning the cut-out mark center 106 with the extended line of the straight line 110 connecting the center of the rotating table 42 and the fixed shaft 104 of the transfer arm 26.

Figure 14:
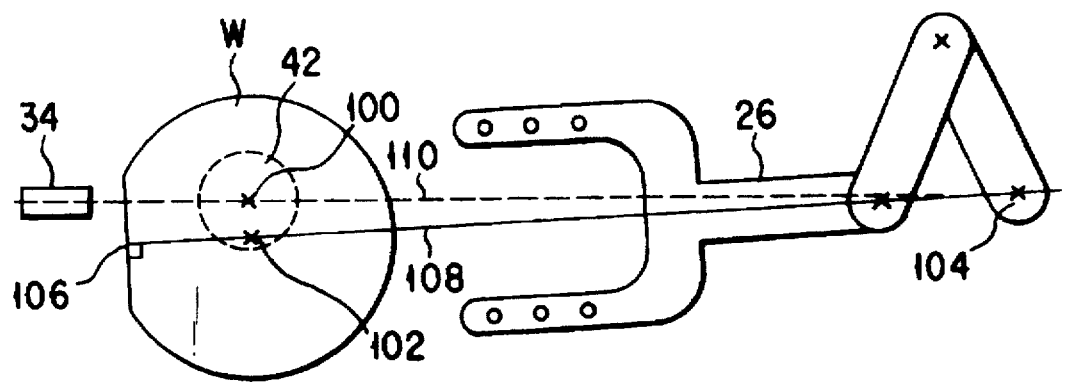
FIGS. 14 and 15 are schematic plan views showing the operations of the positioning apparatus and a transfer unit in FIG. 1.

According to the present invention, therefore, after the eccentricity magnitude and direction of the wafer W and the position of the cut-out mark are detected by the positioning apparatus, the rotating table 42 is rotated to align the fixed shaft 104 of the transfer arm 26 with the extended line of the straight line 108 connecting the center 102 of the wafer W and the cut-out mark center 106, as shown in FIG. 14. With this operation, the approach line of the transfer arm 26 can be made to coincide with the straight line 108 connecting the center 102 of the wafer W and the cut-out mark center 106, thereby accurately receiving the wafer W.

In the above embodiment, the positioning apparatus of the present invention continuously obtains the eccentricity magnitude and direction of the wafer W and the cut-out mark position by a series of processing operations. However, the present invention is not limited to this embodiment, but may be applied to a case wherein only the cut-out mark position is obtained. A positioning apparatus for obtaining only the cut-out mark position according to an embodiment of the present invention will be described below with reference to FIG. 17.

As shown in FIG. 17, the positioning apparatus of this embodiment comprises a detection means 120, an arithmetic means 122, a candidate search means 124, and an evaluation/selection means 126. The detection means 120 is similar to the detection means 34 in FIG. 7 and used to optically detect the peripheral shape of a wafer W so as to obtain a first peripheral shape signal 128. The first peripheral shape signal 128 is sent to the arithmetic means 122 connected to the output terminal of the detection means 120.

The arithmetic means 122 is similar to the detection means 34 in FIG. 7 and used to obtain a second peripheral shape signal 130 by combining two half-cycle components of the first peripheral shape signal 128 corresponding to one revolution (360 degrees) of the wafer W placed on the rotating table 42 with the components being shifted in phase by a half-period (180 degrees). As shown in FIG. 17, in the second peripheral shape signal 130, the curve portions shifted from each other by a half-period (180 degrees) cancel each other (i.e., the eccentricity of the center of the wafer W with respect to the rotation center of the rotating table 42 is canceled), so that only a peak portion 132 of the cut-out mark becomes conspicuous.

The candidate search means 124 is connected to the output terminal of the arithmetic means 122 for outputting the second peripheral shape signal 130. The candidate search means 124 extracts the conspicuous peak portion 132 of the second peripheral shape signal 130, similar to the peak extracting means in FIG. 7. Note that the candidate search means 124 processes only a signal obtained by combining two half-cycle signal components to a half-period. Therefore, an extracted peak portion 134 is only a cut-out mark candidate, and the actual cut-out mark may be present at the extracted peak portion or a portion shifted therefrom by a half-period. FIG. 17 shows a state wherein two peak candidate portions 134 and 136 are obtained from the first peripheral shape signal 128.

In the positioning apparatus of this embodiment, the evaluation/selection means 126 is connected to the output terminal of the candidate search means 124. The evaluation/selection means 126 selects a portion where the cut-out mark is actually present from the cut-out mark candidate portions 134 and 136 extracted by the candidate search means 124.

In this case, predetermined evaluation patterns like those shown in FIGS. 18A to 18C can be used. These patterns are used to make the difference between a cutout mark portion and the remaining portion conspicuous by performing product sum calculation with respect to the cut-out mark candidate portions 134 and 136 in the first peripheral shape signal 128, i.e., the peak portion 134 extracted on the basis of the second peripheral shape signal 130 and the portion 136 shifted therefrom by a half-period (180 degrees). Note that product sum calculation is performed to calculate ΣSiPi with respect to a signal pattern Si and an evaluation pattern Pi.

As such evaluation patterns, various patterns each having a projection-like peak at a portion corresponding to a signal width within which a cut-out mark is substantially present can be used. For example, the evaluation patterns include a rectangular signal like the one shown in FIG. 18A, a sawtooth signal like the one shown in FIG. 18B, and a parabolic signal like the one shown in FIG. 18C.

If product sum calculation with an evaluation pattern is performed for two cut-out mark candidate portions, and the respective candidate portions are averaged, a product sum signal 138 of a portion corresponding to the actual cut-out mark exhibits a conspicuously large value as compared with a product sum signal 140 of a portion corresponding to another cut-out mark candidate. Therefore, it can be easily determine that the cut-out mark is present on the product sum 138 side.

As has been described above, the positioning apparatus of the present invention can detect the eccentricity magnitude and direction of the wafer W, placed on the rotating table 42, and the position of the cut-out mark of the wafer W at a high speed with a high accuracy as compared with the conventional apparatus and method. The transfer arm 26 can therefore transfer the wafer W into a predetermined process chamber quickly and accurately.

The present invention has been described above by taking an example of the case wherein the positioning apparatus of the present invention is applied to the multi-chamber type process system shown in FIG. 1. This is because the present invention exhibits an excellent function and effects especially when it is applied to a multi-chamber type process system in which a transfer operation is frequently performed by the transfer arm. However, the present invention is not limited to this system. As is apparent, therefore, the present invention is not limited to such a multi-chamber type process system, but can be applied to a sheet-fed or batch type process system, e.g., a CVD apparatus, an etching apparatus, a sputtering apparatus, an ashing apparatus, a diffusion apparatus, an exposure apparatus, or an inspection apparatus, which demands a quick, accurate transfer operation.

In the above embodiments, the present invention is mainly applied to a positioning cut-out, i.e., an orientation flat, obtained by cutting a portion of the periphery of a wafer flat in the horizontal direction. However, the present invention is not limited to such a case, but can be suitably applied to a positioning cut-out, i.e., a notch, obtained by cutting a portion of the periphery of a wafer in the form of a recess.

Even if the present invention is applied to the notch shown in FIG. 3, similar to the case of the orientation flat in FIG. 2, since the amount of light transmitted through the notch portion is larger than that of the remaining portion, a waveform signal almost the same as that obtained in the case of an orientation flat can be obtained. Therefore, the eccentricity magnitude and direction of the wafer W and the direction of the notch can be detected quickly and accurately by processing the obtained first peripheral shape signal according to the present invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A positioning apparatus for positioning an object to be processed which has a substantially circular contour as a dominant contour and a positioning cut-out in a peripheral portion, comprising:

a rotatable table for supporting the object;

detection means for optically detecting a peripheral shape of the object on said table;

first arithmetic means for combining two half-cycle components of a first peripheral shape signal corresponding to a 360-degree revolution of the object and output from said detection means to obtain a second peripheral shape signal, the components being shifted in phase by 180 degrees;

peak extracting means for extracting a peak portion from the second peripheral shape signal;

data invalidating means for setting a certain range, of the first peripheral shape signal, including the peak portion and a range shifted from the certain range by 180 degrees as invalid data;

first curve approximation means for obtaining a third peripheral shape signal by performing curve approximation of the first peripheral shape signal on the basis of valid data obtained by removing the invalid data from the first peripheral shape signal; and second arithmetic means for obtaining an eccentricity direction and amount of the object with respect to a rotation center of said table on the basis of the third peripheral shape signal.

2. An apparatus according to claim 1, further comprising data interpolation means for performing interpolation to change the invalid data of the first peripheral shape signal into valid data on the basis of the remaining valid data.

3. An apparatus according to claim 1, wherein said first curve approximation means comprises sine wave approximation means for performing least squares approximation of N measurement data $(\theta_i, Y_i)$ according to the following equation representing a sine wave:

$$y = a \cdot \sin(\theta + \phi) + c \quad (1)$$

(where
$\phi = \tan^{-1}\{(\Sigma y_i \cos\theta_i)/(\Sigma y_i \sin\theta_i)\}$
$a = \{\Sigma y_i \sin(\theta_i+\phi)\}/\{\Sigma \sin^2(\theta_i+\phi)\}$
$c = (\Sigma y_i)/n \; \Sigma\sin(\theta_i+\phi) = \Sigma\cos(\theta_i+\phi) = 0$).

4. An apparatus according to claim 3, wherein said sine wave approximation means sets an eccentricity magnitude EM and an eccentricity direction ED of the object with respect to the rotation center of said table as EM=|a|, and ED=$-\phi+3\pi/2$ (a>0) and ED=$-\phi+\pi/2$ (a<0).

5. An apparatus according to claim 1, wherein said first curve approximation means comprises cosine wave approximation means for performing least squares approximation of N measurement data $(\theta_i, Y_i)$ according to the following equation representing a cosine wave:

$$y = a \cdot \cos(\theta + \phi) + c \quad (2)$$

(where
$\phi = \tan^{-1}\{(\Sigma y_i \sin\theta_i)/(\Sigma y_i \cos\theta_i)\}$
$a = \{\Sigma y_i \cos(\theta_i+\phi)\}/\{\Sigma \cos^2(\theta_i+\phi)\}$
$c = (\Sigma y_i)/n \; \Sigma\sin(\theta_i+\phi) = \Sigma\cos(\theta_i+\phi) = 0$).

6. An apparatus according to claim 5, wherein said cosine wave approximation means sets an eccentricity magnitude EM and an eccentricity direction ED of the object with respect to the rotation center of said table as EM=|a|, and ED=$-\phi+\pi$ (a>0) and ED=$-\phi$ (a<0).

7. An apparatus according to claim 1, further comprising:
   first drive means for rotating/driving said table;
   a rotatable/extendible transfer arm for receiving the object from said table;
   second drive means for driving said transfer arm to rotate and extend/retract; and
   control means for controlling operations of said table and said transfer arm through said first and second drive means on the basis of the eccentricity direction and amount.

8. An apparatus according to claim 1, further comprising:
   second selection means for selecting one of two candidate portions, of the first peripheral shape signal, which correspond to the peak portion of the second peripheral shape signal and are shifted from each other by 180 degrees as a portion corresponding to the cut-out on the basis of the first and third peripheral shape signals;
   second curve approximation means for obtaining a fourth peripheral shape signal by performing curve approximation of the first peripheral shape signal corresponding to the portion selected by said second selection means; and
   third arithmetic means for obtaining a direction of the cut-out with respect to the rotation center of said table on the basis of the fourth peripheral shape signal.

9. An apparatus according to claim 8, wherein said second selection means obtains a difference between the first peripheral shape signal and the third peripheral shape signal, compares average values of difference data of the two candidate portions, and determines one of the candidate portions as a portion corresponding to the cut-out.

10. An apparatus according to claim 8, wherein said second curve approximation means performs least squares approximation of N measurement data $(\theta_i, y_i)$ according to the following quadratic expression:

$$y=a_0+a_1x+a_2x^2.$$

11. An apparatus according to claim 10, wherein said third arithmetic means obtains an angle β from the quadratic expression, the angle β representing an angle defined by an optical axis of said detection means which extends through the rotation center of said table and a straight line connecting the rotation center and a portion nearest to the cut-out:

$$\beta=-a_1/2a_2 \text{ (for } dy/dx=0).$$

12. An apparatus according to claim 8, further comprising:

first drive means for rotating/driving said table;

a rotatable/extendible transfer arm for receiving the object from said table;

second drive means for driving said transfer arm to rotate and extend/retract; and control means for controlling operations of said table and said transfer arm through said first and second drive means on the basis of the eccentricity direction and amount and a direction of the cut-out.

13. An apparatus according to claim 12, wherein said transfer arm includes a fixed shaft as a rotation center, and when the object is received by said transfer arm, said table is rotated to position the object such that the fixed shaft is located on an extended line of a straight line connecting the center of the object and the center of the cut-out.

14. A process system for processing an object to be processed which has a substantially circular contour as a dominant contour and a positioning cut-out in a peripheral portion, comprising:

a plurality of process chambers for storing and processing the object;

a rotatable table for supporting the object outside said process chambers;

first drive means for rotating/driving said table;

a transfer arm for transferring the object between said process chambers and said table;

second drive means rotating and extending/retracting said transfer arm;

detection means for optically detecting a peripheral shape of the object on said table;

first arithmetic means for combining two half-cycle components of a first peripheral shape signal corresponding to a 360-degree revolution of the object and output from said detection means to obtain a second peripheral shape signal, the components being shifted in phase by 180 degrees;

peak extracting means for extracting a peak portion from the second peripheral shape signal;

data invalidating means for setting a certain range, of the first peripheral shape signal, including the peak portion and a range shifted from the certain range by 180 degrees as invalid data;

first curve approximation means for obtaining a third peripheral shape signal by performing curve approximation of the first peripheral shape signal on the basis of valid data obtained by removing the invalid data from the first peripheral shape signal;

second arithmetic means for obtaining an eccentricity direction and amount of the object with respect to a rotation center of said table on the basis of the third peripheral shape signal; and control means for controlling operations of said table and said transfer arm through said first and second drive means on the basis of the eccentricity direction and amount.

15. A system according to claim 14, further comprising:

second selection means for selecting one of two candidate portions, of the first peripheral shape signal, which correspond to the peak portion of the second peripheral shape signal and are shifted from each other by 180 degrees as a portion corresponding to the cut-out on the basis of the first and third peripheral shape signals;

second curve approximation means for obtaining a fourth peripheral shape signal by performing curve approximation of the first peripheral shape signal corresponding to the portion selected by said second selection means; and third arithmetic means for obtaining a direction of the cut-out with respect to the rotation center of said table on the basis of the fourth peripheral shape signal, and wherein said control means controls operations of said table and said transfer arm through said first and second drive means on the basis of the eccentricity direction and amount and the direction of the cut-out.

16. A system according to claim 15, wherein said transfer arm includes a fixed shaft as a rotation center, and when the object is received by said transfer arm, said table is rotated to position the object such that the fixed shaft is located on an extended line of a straight line connecting the center of the object and the center of the cut-out.

* * * * *